US008203396B2

(12) United States Patent
Endo

(10) Patent No.: US 8,203,396 B2
(45) Date of Patent: Jun. 19, 2012

(54) THIN FILM BALUN

(75) Inventor: Makoto Endo, Tokyo (JP)

(73) Assignee: TDK Corporation, Tokyo (JP)

(*) Notice: Subject to any disclaimer, the term of this patent is extended or adjusted under 35 U.S.C. 154(b) by 321 days.

(21) Appl. No.: 12/654,500

(22) Filed: Dec. 22, 2009

(65) Prior Publication Data

US 2010/0164643 A1 Jul. 1, 2010

(30) Foreign Application Priority Data

Dec. 26, 2008 (JP) ................................ 2008-333093

(51) Int. Cl.
*H03H 7/42* (2006.01)
*H01P 3/08* (2006.01)

(52) U.S. Cl. .......................................... 333/26; 333/246

(58) Field of Classification Search .................... 333/25, 333/26, 238, 246
See application file for complete search history.

(56) References Cited

U.S. PATENT DOCUMENTS

| | | | | |
|---|---|---|---|---|
| 5,497,137 | A | 3/1996 | Fujiki | |
| 7,250,828 | B2 * | 7/2007 | Erb | 333/26 |
| 7,511,591 | B2 * | 3/2009 | Ezzendine | 333/26 |
| 7,528,676 | B2 * | 5/2009 | Kearns et al. | 333/26 |
| 7,692,511 | B2 * | 4/2010 | Degani et al. | 333/25 |
| 7,864,014 | B2 * | 1/2011 | Ezzeddine | 336/200 |
| 7,948,331 | B2 * | 5/2011 | Endo | 333/25 |
| 8,085,111 | B2 * | 12/2011 | Endo | 333/26 |
| 8,143,968 | B2 * | 3/2012 | Endo | 333/26 |

FOREIGN PATENT DOCUMENTS

| | | |
|---|---|---|
| JP | A-7-176918 | 7/1995 |
| JP | A-2004-120291 | 4/2004 |

* cited by examiner

*Primary Examiner* — Dean O Takaoka
(74) *Attorney, Agent, or Firm* — Oliff & Berridge, PLC

(57) ABSTRACT

The present invention provides a thin film balun capable of preventing a resonant frequency from being increased to a high frequency, and thus realizing a preferable passage characteristic. A thin film balun 1 includes: an unbalanced transmission line 2 having a first coil portion C1 and a second coil portion C2; and a balanced transmission line 3 having a third coil portion C3 and a fourth coil portion C4 which are magnetically coupled with the first coil portion C1 and the second coil portion C2, respectively. The first coil portion C1 is connected to an unbalanced terminal T0, and the second coil portion C2 is connected to a ground terminal G (ground potential) via a capacitor D (C component). The third coil portion C3 is connected to a balanced terminal T1 and the fourth coil portion C4 is connected to a second balanced terminal T2. The capacitor D is provided, in a plan view, in an area S1 between the outer end of the unbalanced terminal T0 and the outer end of the ground terminal G.

4 Claims, 25 Drawing Sheets

THIN FILM BALUN

BACKGROUND

1. Field of the Invention

The present invention relates to a balun (a balun transformer) that performs conversion between unbalanced and balanced signals, and in particular relates to a thin film balun that is formed by a thin film process advantageous for size and thickness reductions.

2. Description of Related Art

A wireless communication device includes various high frequency elements such as an antenna, a filter, an RF switch, a power amplifier, an RF-IC, and a balun. Of these elements, a resonant element such as an antenna or a filter handles (transmits) an unbalanced signal which is based on a ground potential, whereas an RF-IC which generates or processes a high frequency signal handles (transmits) a balanced signal. Accordingly, when electromagnetically connecting these two elements, a balun that functions as an unbalanced-balanced converter is used.

Recently, thin film baluns that are formed by a thin film process advantageous for size and thickness reductions have been increasingly used for mobile communication devices such as mobile phones and mobile terminals, wireless LANs, etc., and in order to meet the need for further size reduction of such devices, further reductions in the sizes and thicknesses of the thin film baluns have also come to be desired. Examples of such thin film baluns which have been proposed include: a chip type balun having a multilayer coil structure (see, for example, reference 1: Japanese Patent Application Laid-Open No. 7-176918); and a balun in which: a magnetic coupling is formed by an unbalanced transmission line and a balanced transmission line which are arranged so as to face each other; one end of the unbalanced transmission line is connected to an unbalanced terminal while the other end is connected to a ground terminal via a capacitor; and an output balanced terminal is connected to the balanced transmission line (see, for example, reference 2: Japanese Patent Application Laid-Open No. 2004-120291).

As a passage characteristic of a thin film balun, a resonant frequency is expressed by formula (1) below.

$$fr=1/\{2\pi(L\cdot C)^{1/2}\} \quad (1),$$

In formula (1), fr represents a resonant frequency, L (L component) represents an equivalent inductance of a resonant circuit constituted from an unbalanced transmission line and a balanced transmission line, and C (C component) represents an equivalent capacitance of the resonant circuit.

In order to reduce the size and thickness of a thin film balun, the number of turns or the length of lines of coils, etc. which constitute an unbalanced transmission line and a balanced transmission line are inevitably reduced, and thus the inductance L of a resonant circuit will be lowered and the resonant frequency fr (frequency in a pass band) will be increased to a high frequency, as is obvious from formula (1). Generally, a required specification of a passage characteristic in a frequency of a thin film balun used for wireless communication, etc. (an attenuation characteristic in a predetermined frequency) is set based on the configuration, standard, specifications, etc., of a communication device or a system to be equipped with the thin film balun, and the passage characteristic is particularly important in the characteristics of the thin film baluns. Specifically, for example, the peak value of the resonant frequency fr is specified to be in the range between 2400 and 2500 MHz (2.4 GHz band) as the passage characteristic, and the specification is designed so that an attenuation in such a frequency band is sufficiently suppressed to be low. However, if the resonant frequency fr is increased to a high frequency due to the size and thickness reductions of the thin film balun as described above, it will be difficult chip type baluns such as the one disclosed in reference 1 to satisfy such a required specification.

Meanwhile, while the resonant frequency fr can be prevented from being increased to a high frequency by increasing the capacitance C of the resonant circuit as can be seen in formula (1) above, based on the inventors' knowledge, it might be difficult to obtain a desired passage characteristic for a transmission signal only by providing a capacitor in order to simply increase the capacitance as in the thin film balun disclosed in reference 2.

SUMMARY

The present invention has been made in light of the above circumstances, and an object of the present invention is to provide a thin film capable of preventing a resonant frequency from being increased to a high frequency due to size and thickness reductions, and thus realizing a required preferable passage characteristic.

In order to achieve the object above, a thin film balun according to an aspect of the present invention includes: an unbalanced transmission line having a first line portion and a second line portion; a balanced transmission line having a third line portion and a fourth line portion which are arranged so as to face the first line portion and the second line portion, respectively; an unbalanced terminal connected to the first line portion; a ground terminal connected to the second line portion via a C component (capacitance component); a first balanced terminal connected to the third line portion: and a second balanced terminal connected to the fourth line portion, wherein the line portions which are arranged so as to face each other form magnetic couplings. In other words, a first magnetic coupling is formed by the first line portion and the third line portion, and a second magnetic coupling is formed by the second line portion and the fourth line portion. The C component is provided in an area between the outer end (the end most distant from the ground terminal) of the unbalanced terminal and the outer end (the end most distant from the unbalanced terminal) of the ground terminal. Note that the "ground terminal" is synonymous with the "ground potential."

With such a configuration, the C component connected to the second line portion that is included in the unbalanced transmission line introduces a capacitance C in a resonant circuit of the thin film balun, thereby suppressing an increase in a resonant frequency. The inventors, after devoting themselves to research, found that a passage characteristic for a transmission signal can be adjusted to a predetermined range (specification) by providing the C component in the area between the outer end (the end most distant from the ground terminal) of the unbalanced terminal and the outer end (the end most distant from the unbalanced terminal) of the ground terminal as described above.

Although the effect and the mechanism are not known in detail, one possible factor would be that, by providing the C component in the area between the outer end of the unbalanced terminal and the outer end of the ground terminal, not only the C component directly connected to the ground terminal but also a capacitance such as a stray capacitance is generated between, for example, an electrode of a capacitor (described later) and the unbalanced terminal, which are included in the C component, thereby increasing an effective capacitance on the side of the unbalanced transmission line. However, the effects are not limited to the effect above.

It is preferable to provide the C component in the area between the inner end (the end closest to the ground terminal) of the unbalanced terminal and the inner end (the end closest to the unbalanced terminal) of the ground terminal, so that the passage characteristic of the transmission signal can be further improved.

Focusing on the positional relationship of the C component relative to the unbalanced terminal and the ground terminal, it is more preferable to provide the C component in an area closer to the unbalanced terminal and the ground terminal rather than to the balanced terminals (at a position more distant from the balanced terminals). In other words, it is more effective to provide the C component in the area between the outer end (more preferably, inner end) of the unbalanced terminal and the outer end (more preferably, inner end) of the ground terminal, and at a position closer to the unbalanced terminal and ground terminal rather than to the balanced terminals. Such a configuration has been found to further improve the passage characteristic for the transmission signal. It is expected that, due to the reduced distance between, for example, the electrode of the capacitor and the unbalanced terminal, which are included in the C component, the above-described capacitance generated between the electrode of the capacitor and the unbalanced terminal is further increased, and thus the effective capacitance on the side of the unbalanced transmission line is further increased. However, the effects are not limited to the effect above.

Specifically, the configuration in which the first to fourth line portions are primarily constituted from respective coil portions can be provided as an example, and such a configuration can provide effects that are similar to those described above.

In other words, the thin film balun according to the aspect of the present invention may be configured to include: an unbalanced transmission line having a first coil portion and a second coil portion; a balanced transmission line having a third coil portion and a fourth coil portion which are arranged so as to face the first coil portion and the second coil portion, respectively; an unbalanced terminal connected to the first coil portion; a ground terminal connected to the second coil portion via a C component; a first balanced terminal connected to the third coil portion; and a second balanced terminal connected to the fourth coil portion, wherein the C component is provided in a region between the outer end of the unbalanced terminal and the outer end of the ground terminal. In such a configuration, a first magnetic coupling is formed by the first coil portion and the third coil portion, and a second magnetic coupling is formed by the second coil potion and the fourth coil portion.

More specifically, a capacitor which has: a first electrode connected to the second coil portion; and a second electrode arranged so as to face the first electrode via a dielectric layer and connected to the ground terminal electrode, as well as a configuration including such a capacitor, may be provided as examples of the C component.

In the present invention, since the C component (capacitor) connected to the ground terminal is provided in the area between the outer end of the unbalanced terminal and the outer end of the ground terminal, a resonant frequency can be effectively prevented from being increased to a high frequency due to size and thickness reductions of a thin film balun, and thus a required preferable passage characteristic can be achieved.

DETAILED DESCRIPTION OF PREFERRED EMBODIMENTS

Figure 1:
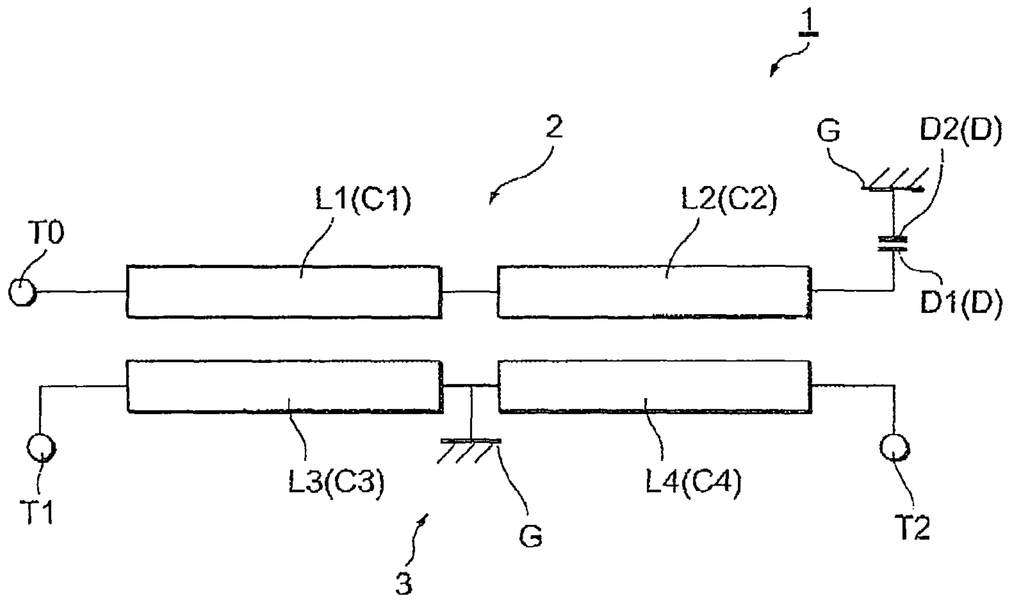
FIG. 1 is an equivalent circuit diagram showing a configuration of a preferred embodiment according to a thin film balun in the present invention.

An embodiment of the present invention will be described below with reference to the attached drawings. Note that the same components in the drawings are given the same reference numerals, and repeated descriptions are omitted. The positional relationships such as the top, bottom, left, and right are based on the positional relationships shown in the drawings, unless otherwise specified. Furthermore, scale ratios of the drawings are not limited to the illustrated ratios. Note also that the following embodiments are merely examples for describing the present invention, and that the present invention is not limited only to the embodiments. Various modifications may be made to the present invention without departing from the scope of the present invention.

FIG. 1 is an equivalent circuit diagram showing a configuration of a preferred embodiment according to a thin film balun in the present invention. A thin film balun 1 includes: an unbalanced transmission line 2 in which a line portion L1 (first line portion) and a line portion L2 (second line portion) are connected in series; and a balanced transmission line 3 in which a line portion L3 (third line portion) and a line portion L4 (fourth line portion) are connected in series, where a magnetic coupling is formed between the line portion L1 and the line portion L3 and between the line portion L2 and the line portion L4. Note that, the former forms a first magnetic coupling and the latter forms a second magnetic coupling, though an area where two magnetic coupling components cannot be clearly distinguished from each other may exist in some configurations.

In the thin film balun 1, an end of the line portion L1, the end being the other end of a coupling end with the line portion L2, is connected to an unbalanced terminal T0, while an end of the line portion L2, the end being the other end of a coupling end with the line portion L1, is connected to a ground terminal G (ground potential) via a capacitor D (C component (capacitance component)). In the capacitor D, an electrode D1 (first electrode) connected to the other end of the line portion L2 and an electrode D2 (second electrode) connected to the ground terminal G are arranged so as to face each other via a suitable dielectric body. Ends of the line portion L3 and line portion L4, the ends being the other ends of the respective coupling ends, are connected respectively to a balanced terminal T1 (first balanced terminal) and a balanced terminal T2 (second balanced terminal). A coupled portion between the line portion L3 and line portion L4 is grounded to the same potential as the ground terminal G.

The lengths of the line portions L1, to L4 above change depending on specifications of the thin film balun 1, and the lengths may be selected so as to form, for example, a quarter-wavelength (λ/4) resonator circuit of a transmission signal which is subject to conversion. The shapes of the line portions L1 to L4 can be arbitrarily selected as long as the above magnetic couplings can be formed, examples of which may include a spiral shape (coil shape), a zigzag shape, a straight line, and a curved line.

A basic operation of the thin film balun 1 will be described below, with reference to FIG. 1. In the thin film balun 1 described above, when an unbalanced signal is input in the unbalanced terminal T0, the unbalanced signal propagates through the line portion L1 and the line portion L2. Due to the magnetic coupling between the line portion L1 and the line portion L3 (first magnetic coupling) and the magnetic coupling between the line portion L2 and the line portion L4 (second magnetic coupling), the input unbalanced signal is converted to two balanced signals whose phases are different by 180° (π), and the two balanced signals are output respectively from the balanced terminal T1 and the balanced terminal T2. A converting operation from balanced signals to an unbalanced signal is made in the reverse manner of the converting operation from the unbalanced signal to the balanced signals described above.

The following description describes an embodiment of the thin film balun 1 which uses, as line portions L1 to L4, coil portions constituted from coil conductors.

Embodiment 1

Figure 2:
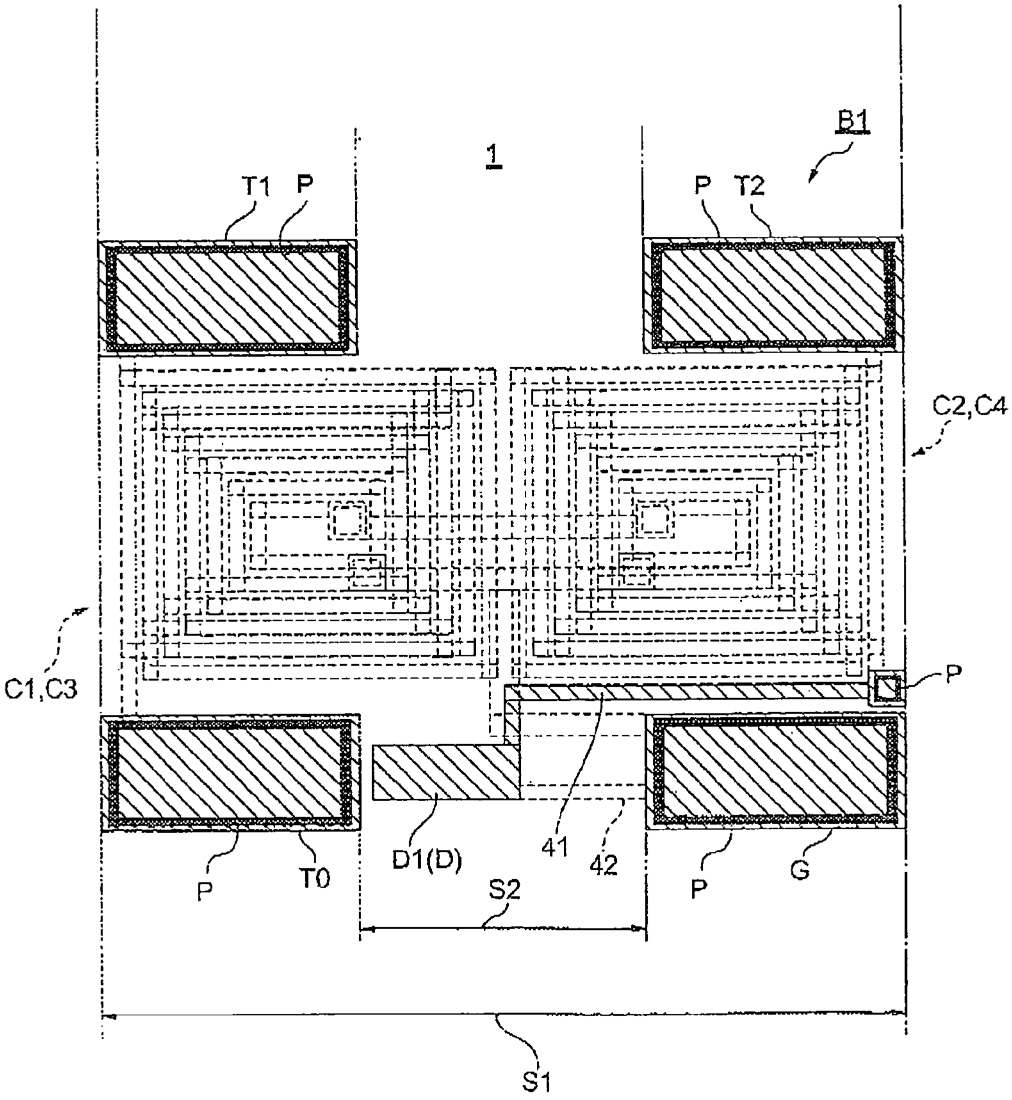
FIG. 2 is a horizontal sectional view showing a wiring layer B1 of a thin film balun 1.
Figure 3:
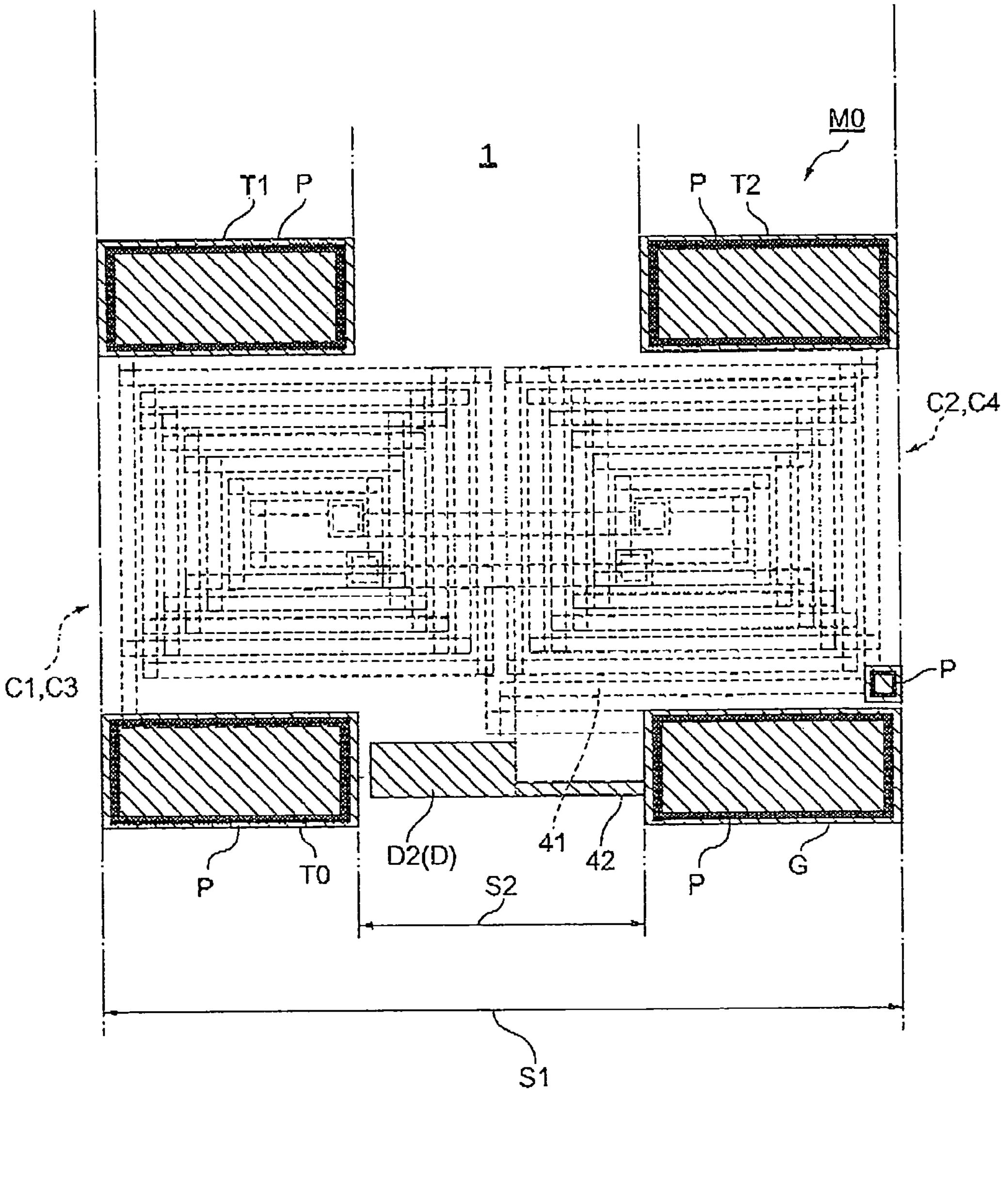
FIG. 3 is a horizontal sectional view showing a wiring layer M0 of the thin film balun 1.
Figure 4:
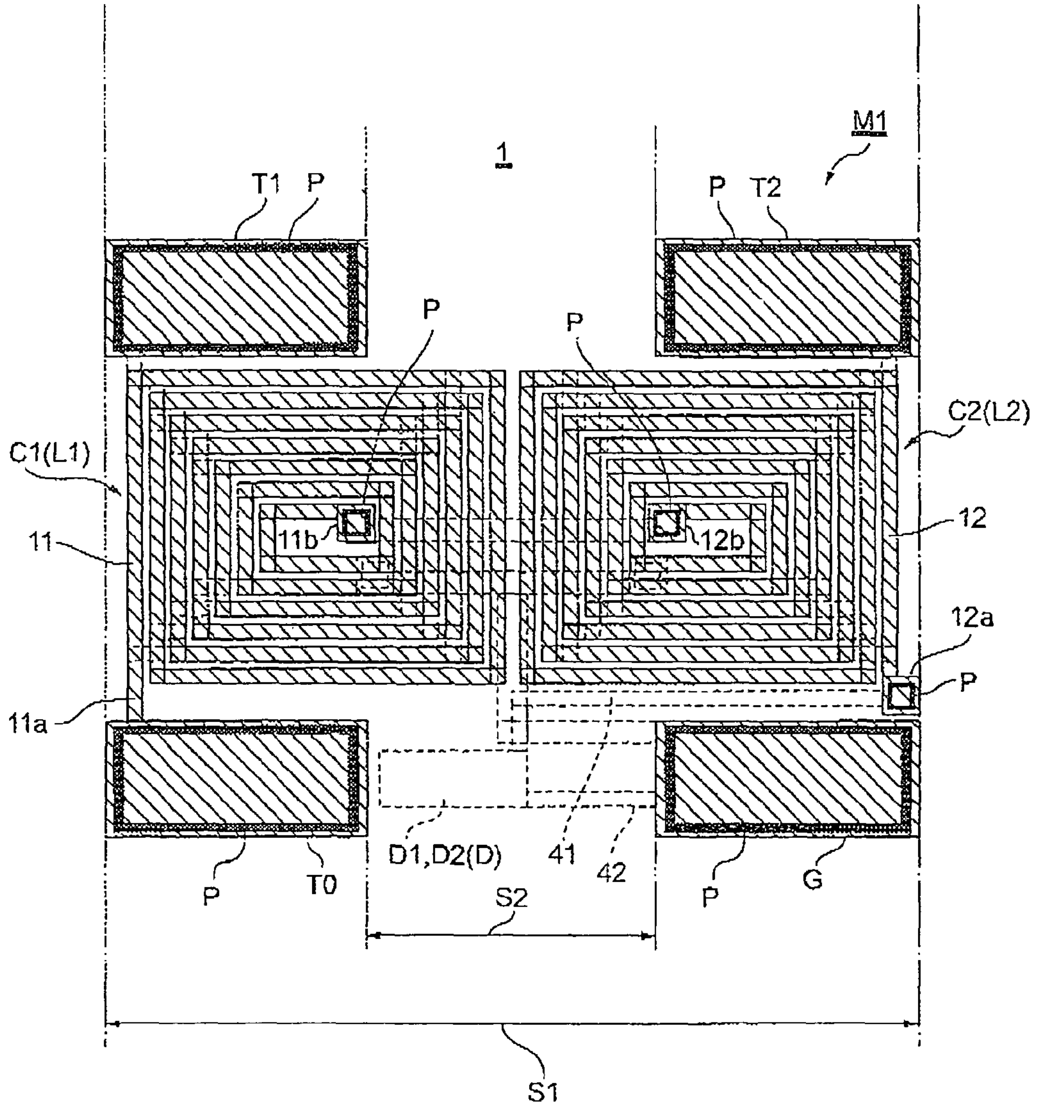
FIG. 4 is a horizontal sectional view showing a wiring layer M1 of the thin film balun 1.
Figure 5:
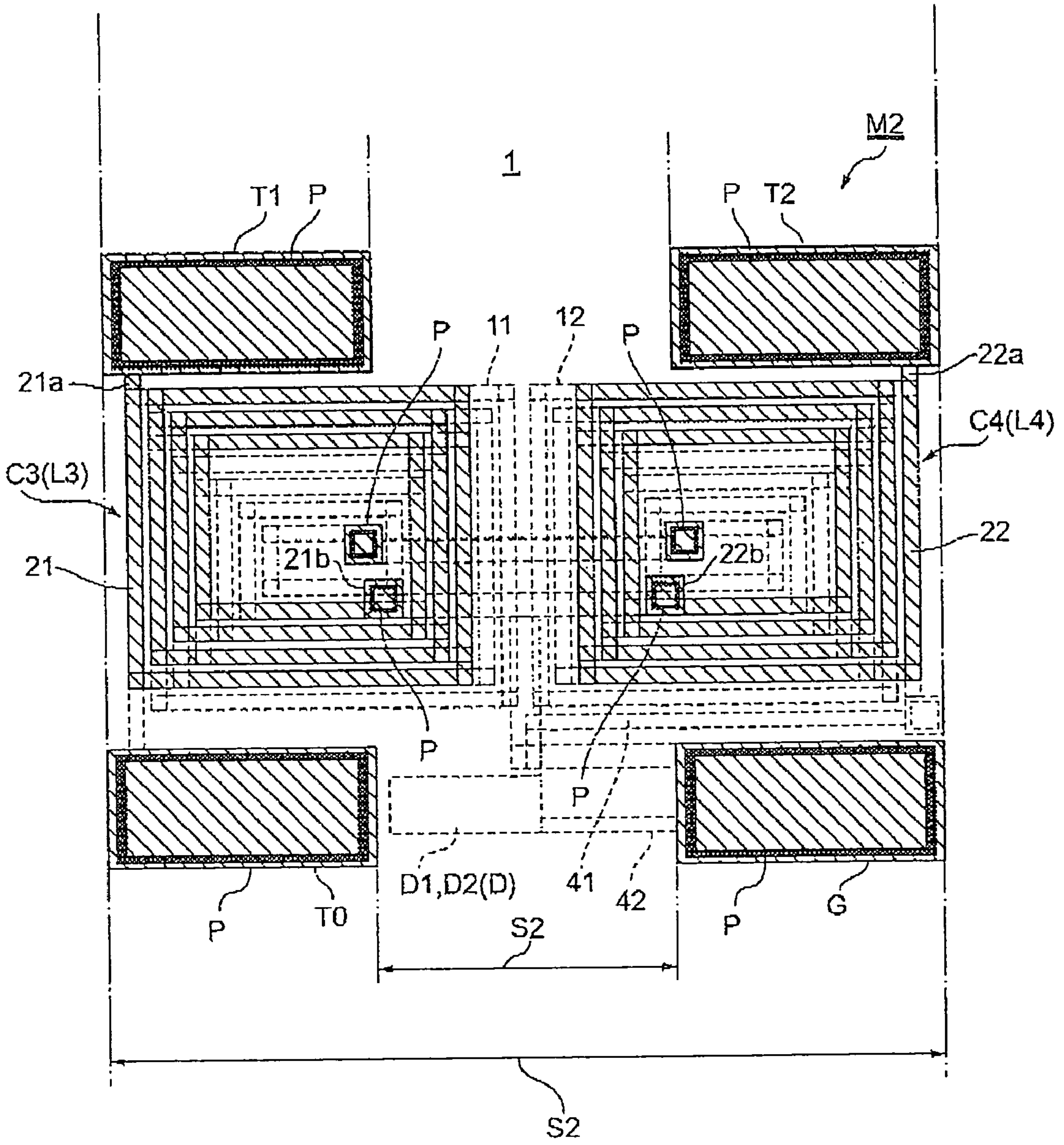
FIG. 5 is a horizontal sectional view showing a wiring layer M2 of the thin film balun 1.
Figure 6:
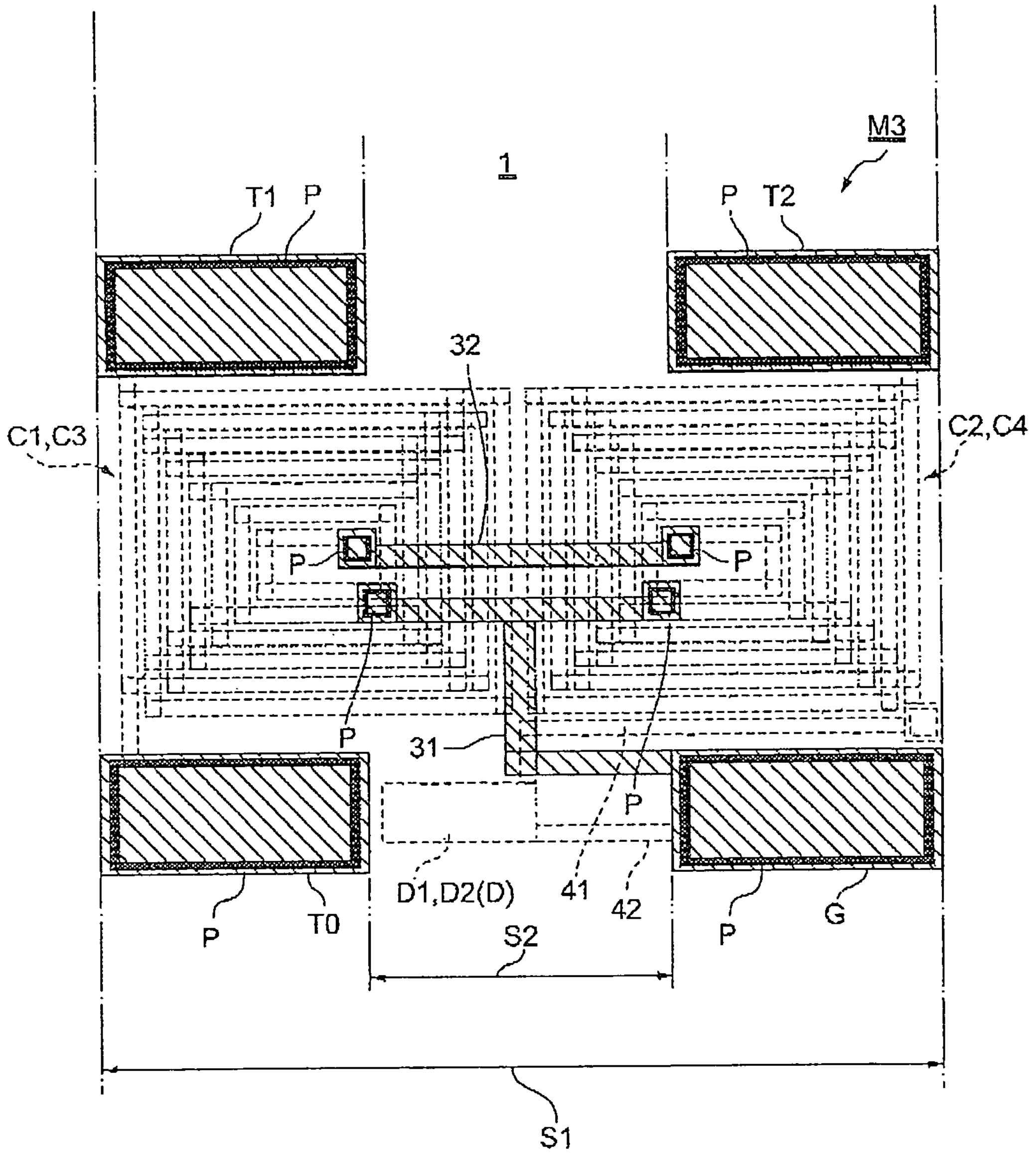
FIG. 6 is a horizontal sectional view showing a wiring layer M3 of the thin film balun 1.
Figure 7:
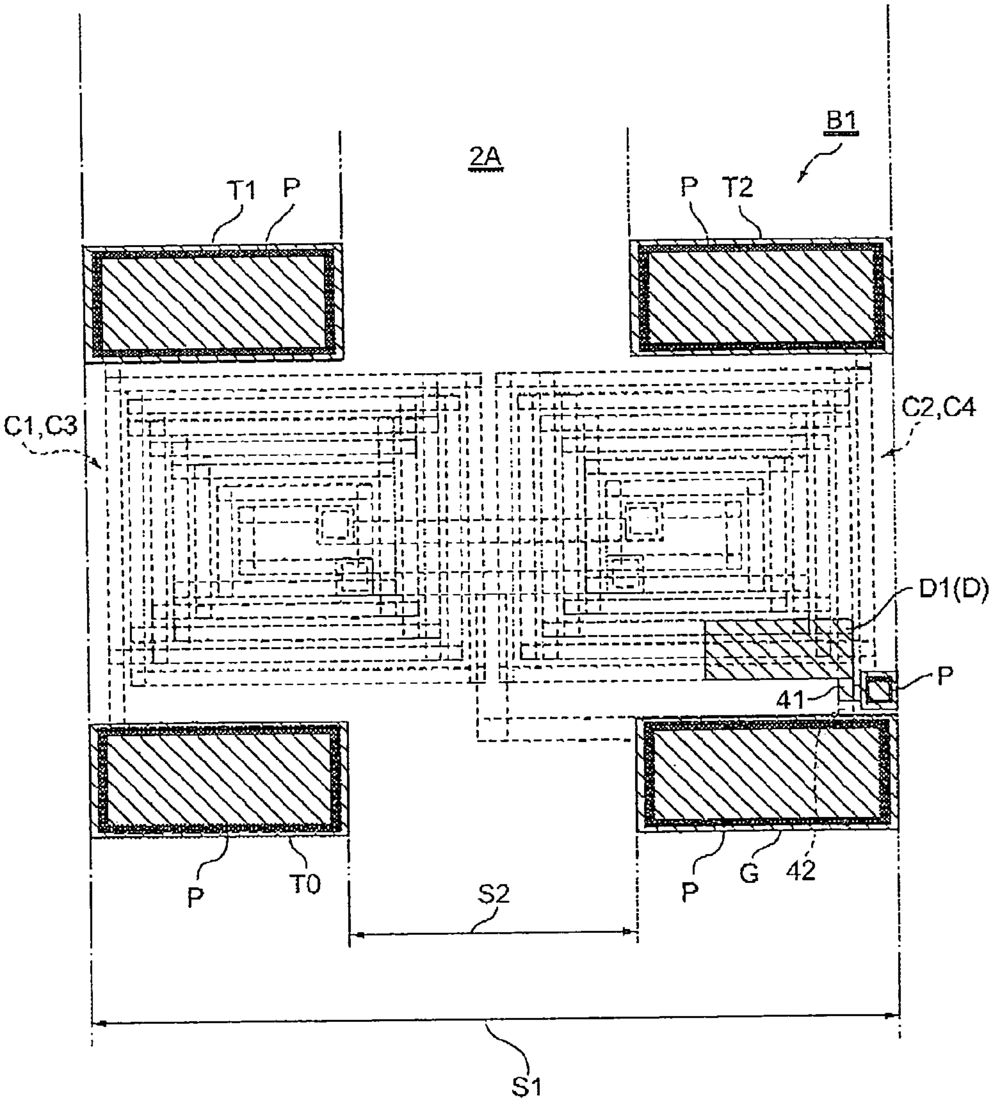
FIG. 7 is a horizontal sectional view showing a wiring layer B1 of a thin film balun 2A.
Figure 8:
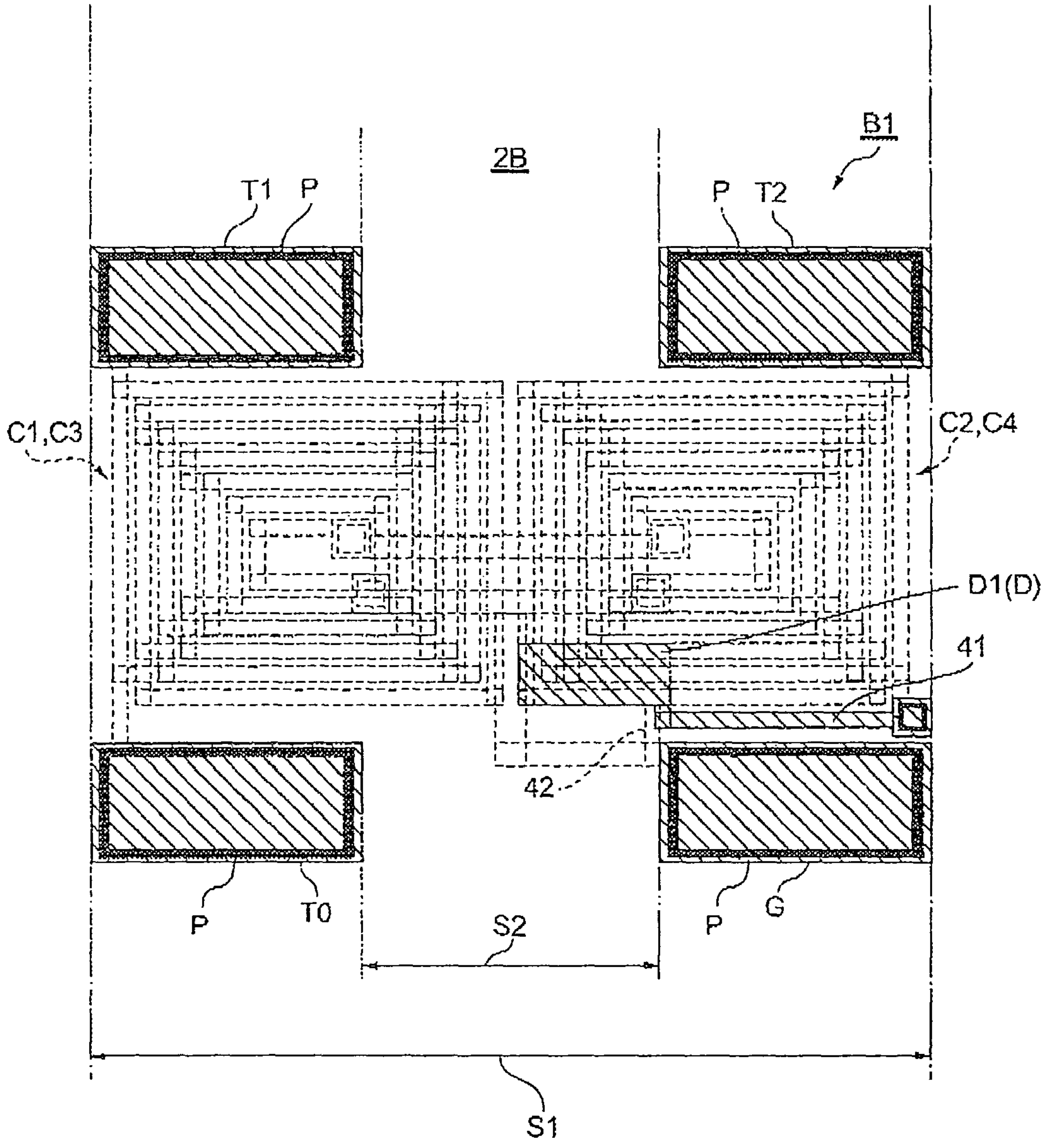
FIG. 8 is a horizontal sectional view showing a wiring layer B1 of a thin film balun 2B.
Figure 9:
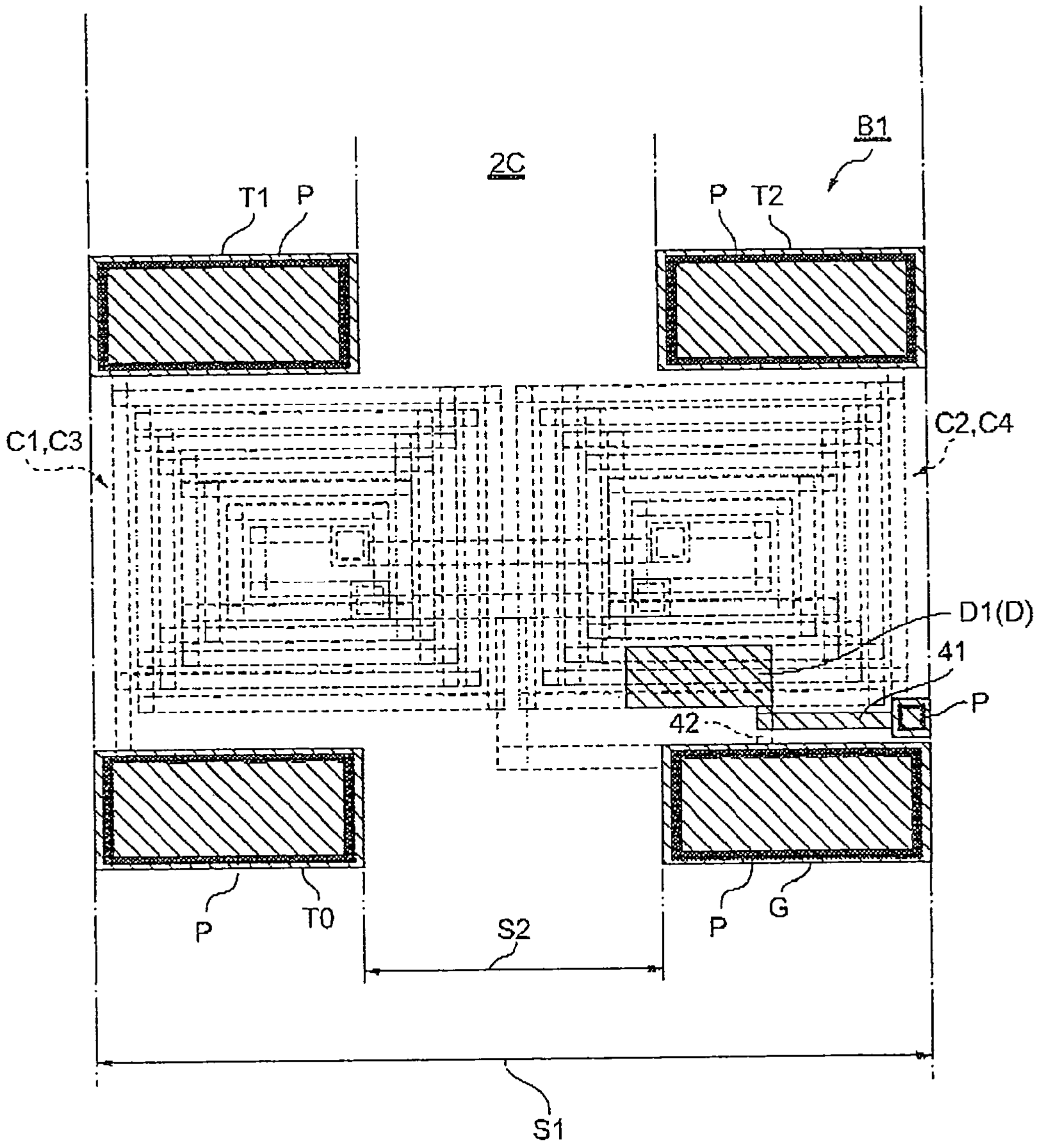
FIG. 9 is a horizontal sectional view showing a wiring layer B1 of a thin film balun 2C.
Figure 10:
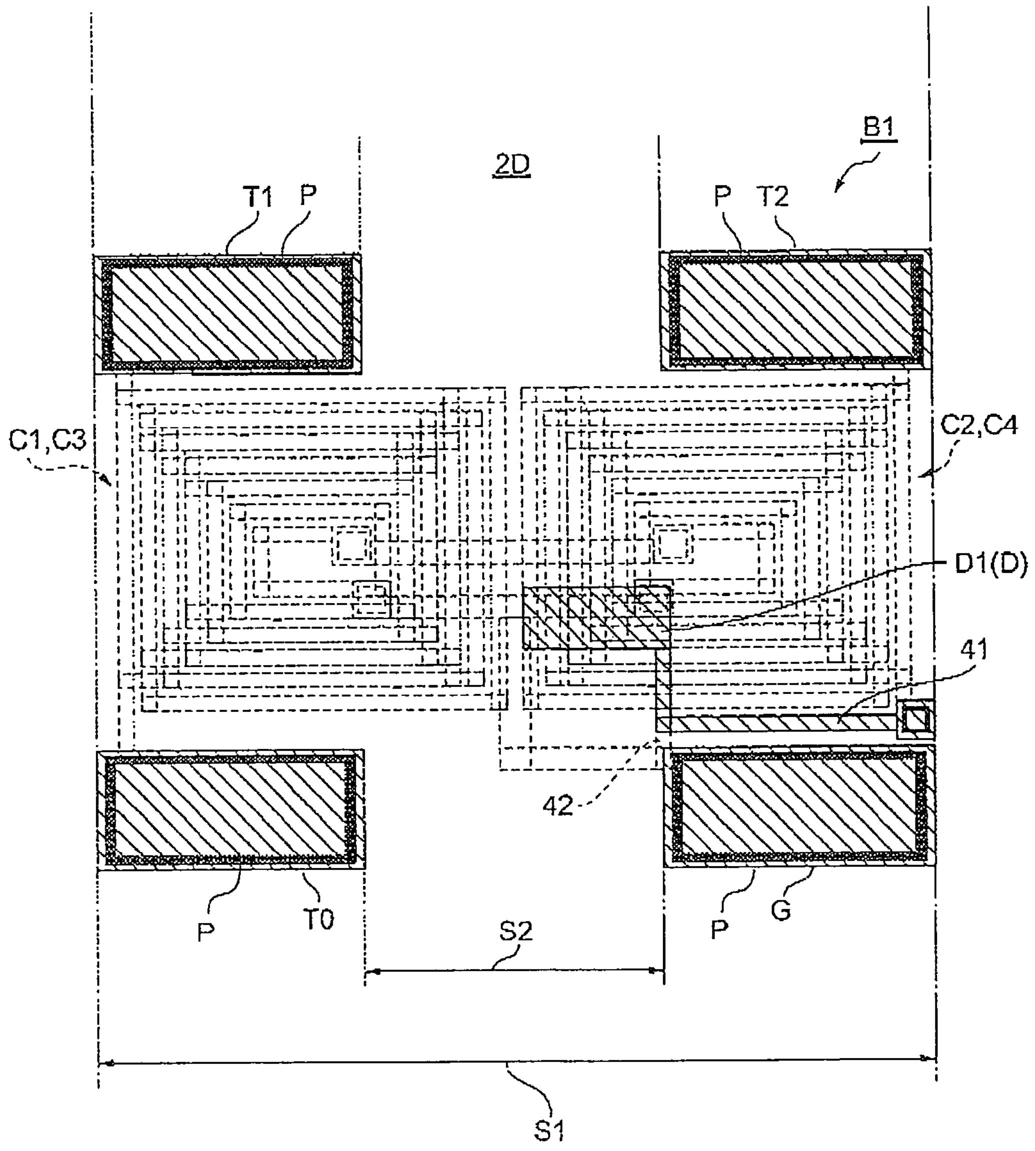
FIG. 10 is a horizontal sectional view showing a wiring layer B1 of a thin film balun 2D.
Figure 11:
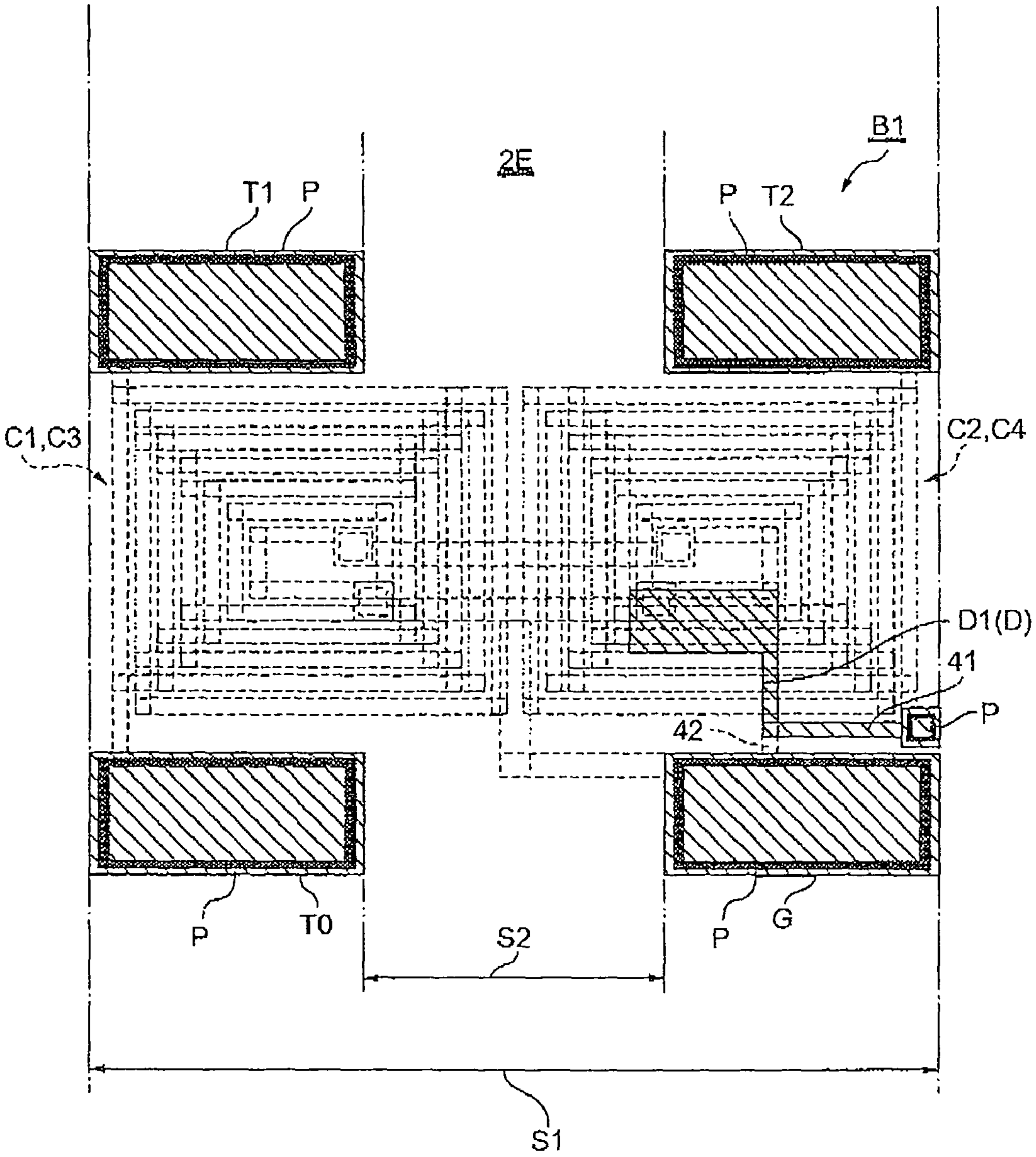
FIG. 11 is a horizontal sectional view showing a wiring layer B1 of a thin film balun 2E.
Figure 12:
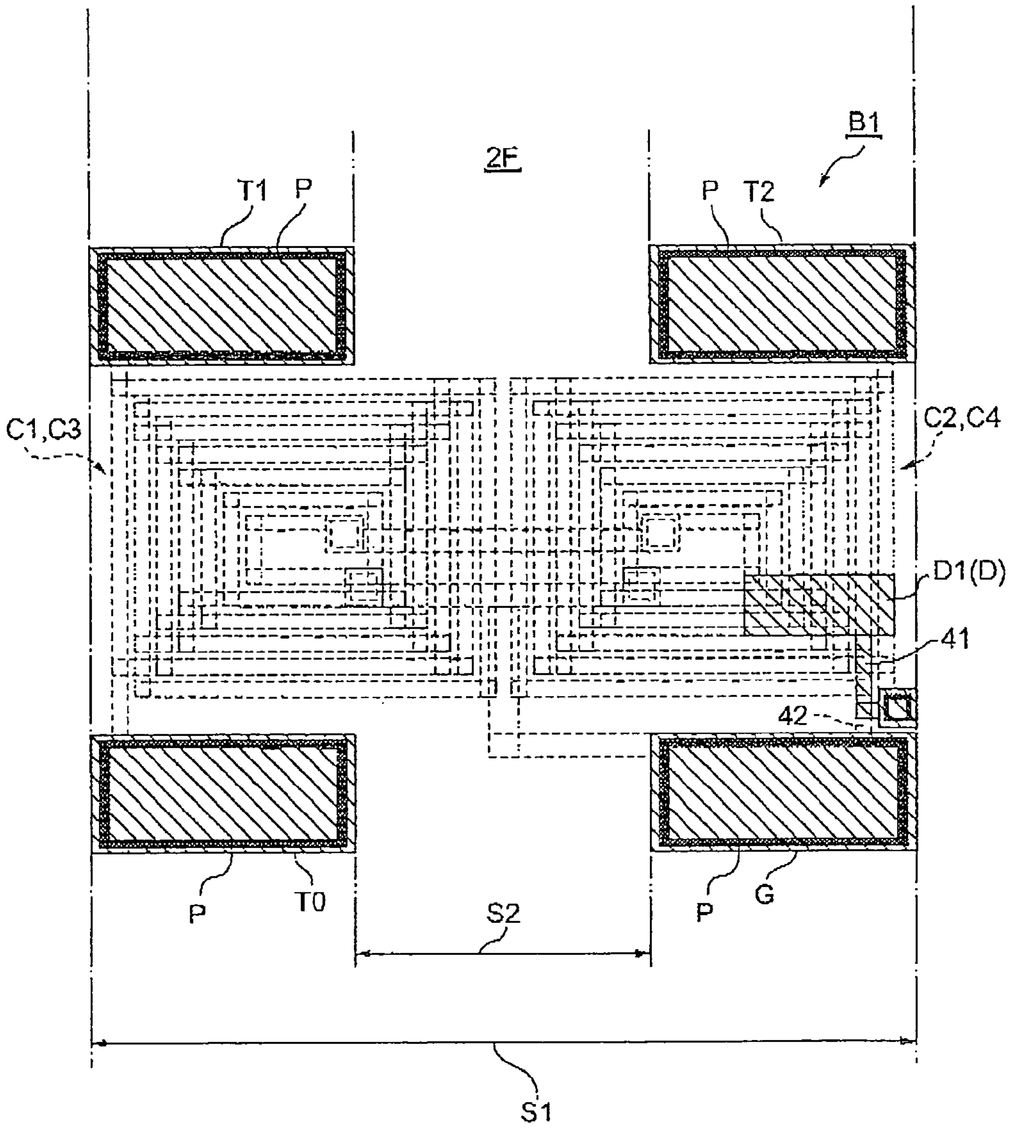
FIG. 12 is a horizontal sectional view showing a wiring layer B1 of a thin film balun 2F.
Figure 13:
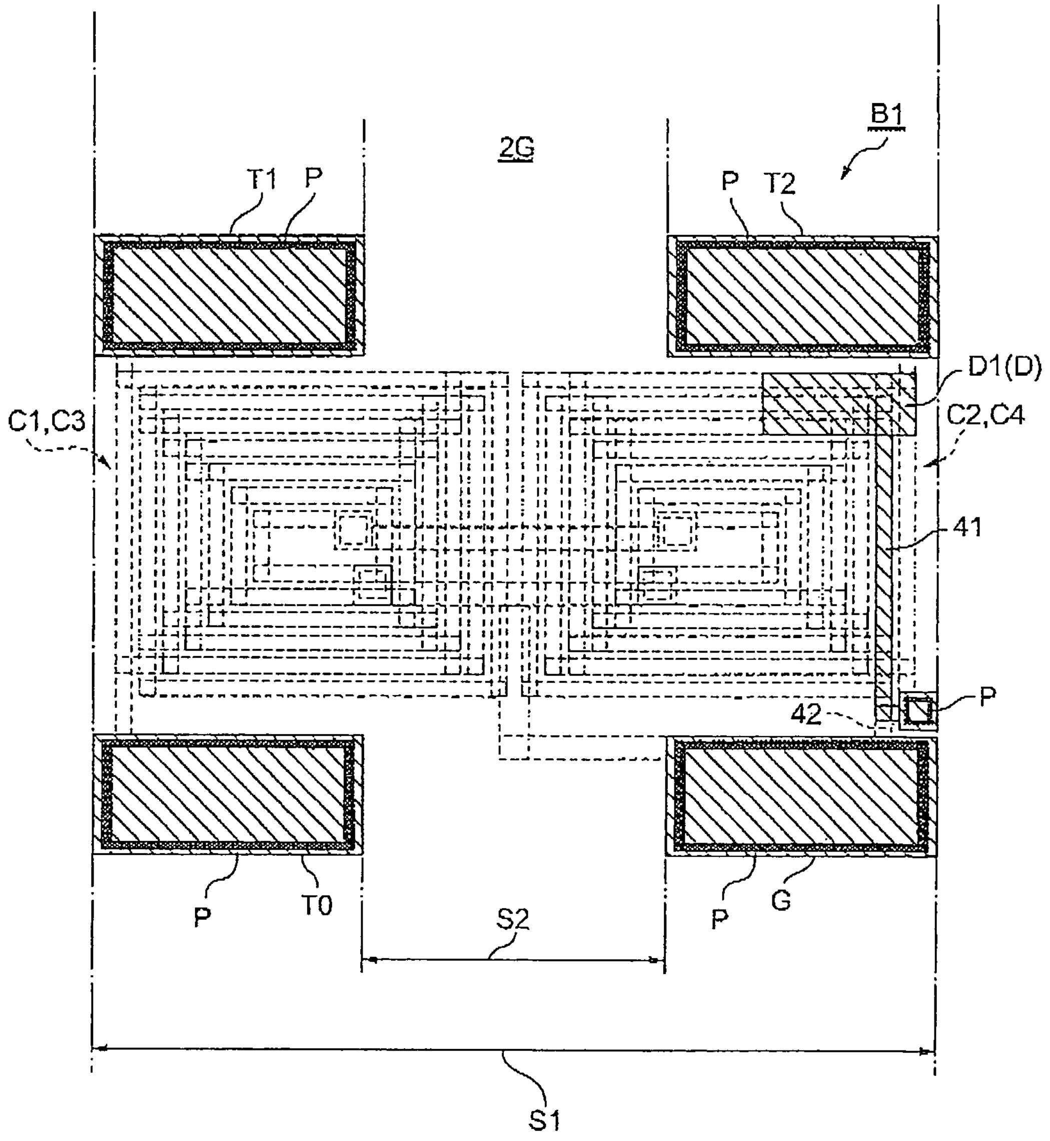
FIG. 13 is a horizontal sectional view showing a wiring layer B1 of a thin film balun 2G.
Figure 14:
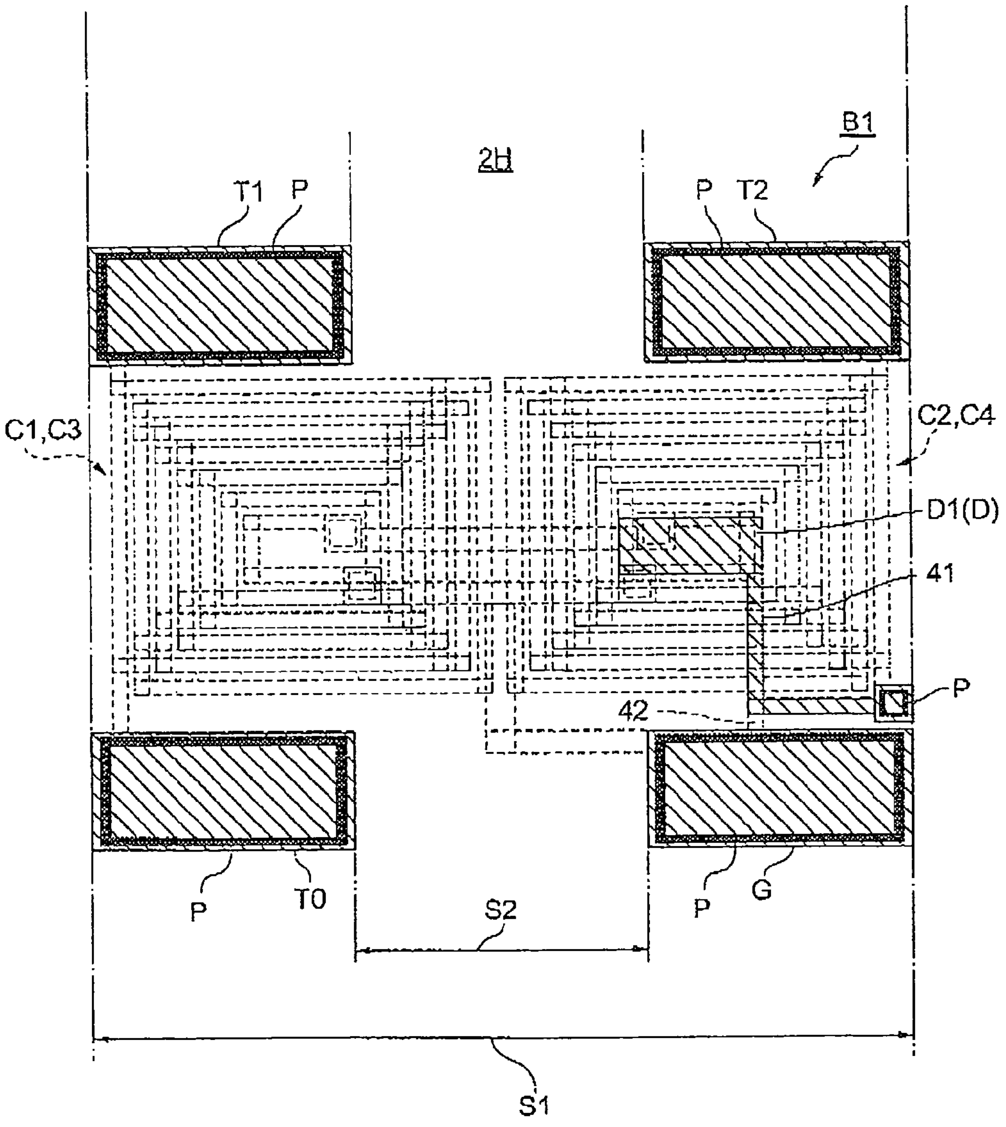
FIG. 14 is a horizontal sectional view showing a wiring layer B1 of a thin film balun 2H.
Figure 15:
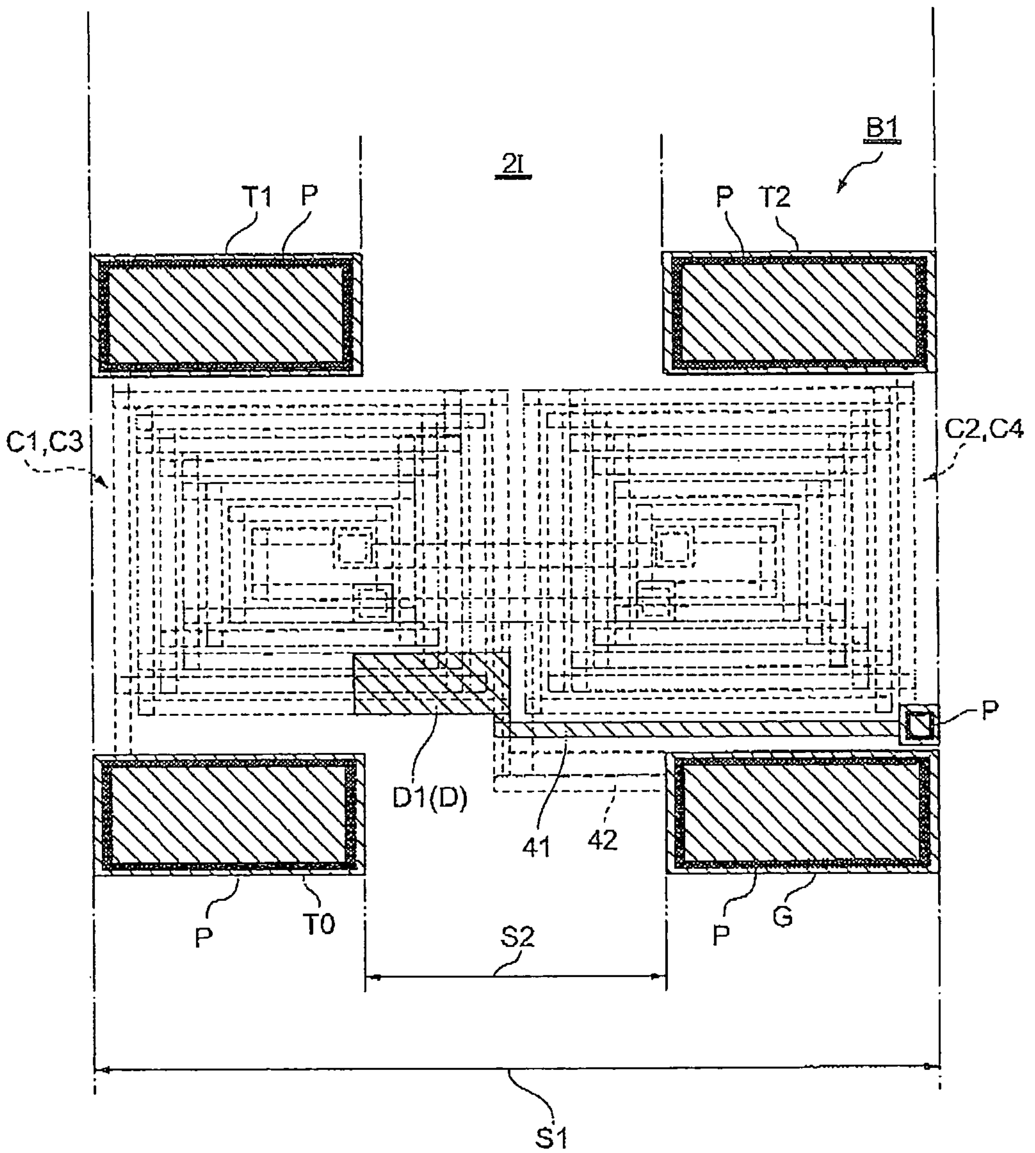
FIG. 15 is a horizontal sectional view showing a wiring layer B1 of a thin film balun 2I.
Figure 16:
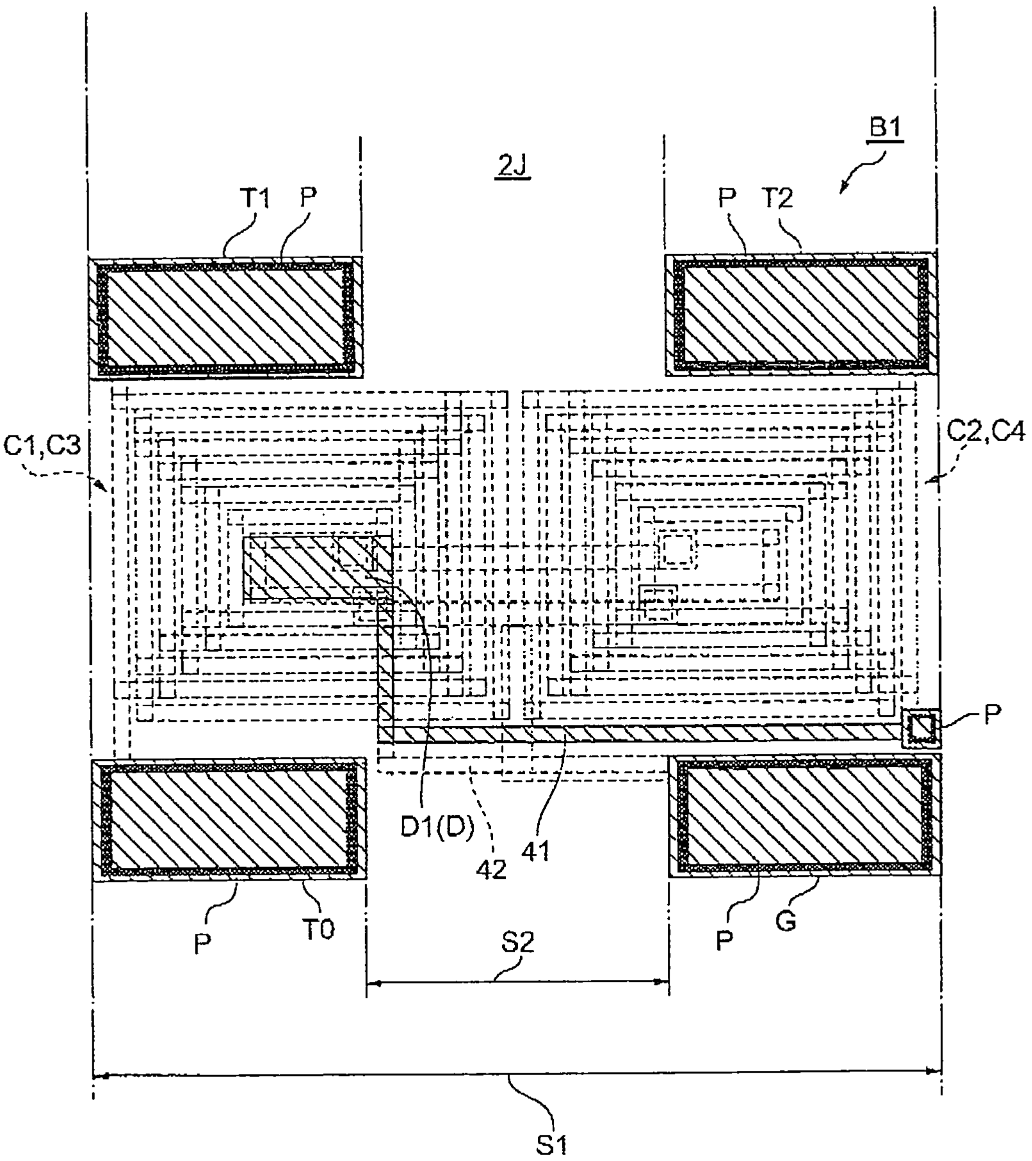
FIG. 16 is a horizontal sectional view showing a wiring layer B1 of a thin film balun 2J.
Figure 17:
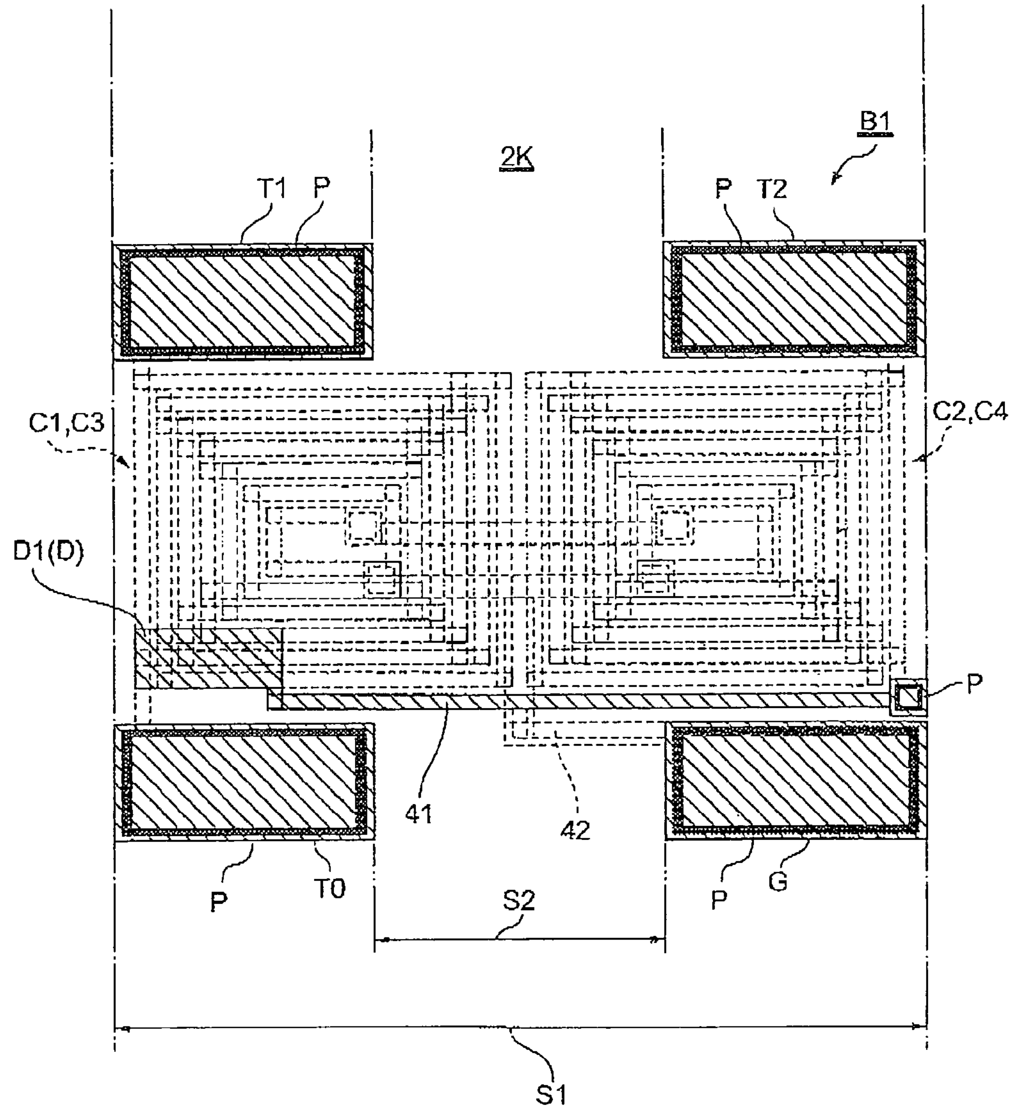
FIG. 17 is a horizontal sectional view showing a wiring layer B1 of a thin film balun 2K.

FIGS. 2 to 6 are horizontal sectional views schematically showing each wiring layer of the thin film balun 1 in embodiment 1. Specifically, FIG. 2 shows a horizontal cross section at a wiring layer B1 which is formed on an insulating substrate made of, for example, alumina. FIG. 3 shows a horizontal cross section at a wiring layer M0 formed in an insulating layer made of, for example, a polyimide (the same applies to insulating layers mentioned below) via a dielectric layer made of, for example, SiN. FIGS. 4 to 6 show respective horizontal cross sections at wiring layers M1, M2 and M3 which are sequentially formed above the wiring layer M0 respectively via insulating layers. As described above, the thin film balun 1 is constituted from thin film multiple wiring layers which are formed on the insulating substrate.

As shown in FIGS. 2 to 6, the unbalanced terminal T0, the balanced terminals T1 and T2, and the ground terminal G are formed on all of the wiring layers B1 and M0 to M3. Each of the terminals T0 to T2 and G is electrically connected between different layers via through holes P. Note that all through holes P shown in FIGS. 2 to 6 are electroplated for providing electrical conduction between upper and lower layers. The structure of each wiring layer will be described in detail below.

As shown in FIG. 2, on the wiring layer B1 which is formed on the substrate, the electrode D1 of the capacitor D is formed in an area S2 between the inner end of the unbalanced terminal T0 and the inner end of the ground terminal G (the area S2 being the area whose boundary in the longitudinal direction of paper is shown by the alternate long and two short dashes line and whose width direction is indicated by the reference symbol S2 in FIG. 2), and at a position outside the outer circumferences of coil portions C1 to C4 (described later) and relatively close to the unbalanced terminal T0. The electrode D1 is connected to a through hole P provided in the vicinity of the ground terminal G by a wire 41.

As shown in FIG. 2, the inner end of the unbalanced terminal T0 is an end closest to the ground terminal G, and the inner end of the ground terminal G is an end closest to the unbalanced terminal T0. As shown in FIG. 2, the area S2 is included in an area S1 between the outer end of the unbalanced terminal T0 and the outer end of the ground terminal G (the area S1 being the area whose boundary in the longitudinal direction of the paper is shown by the alternate long and short dash line and whose width direction is indicated by the reference symbol S1 in FIG. 2). The outer end of the unbalanced terminal T0 is the end most distant from (spaced away from) the ground terminal G, and the outer end of the ground terminal G is the end most distant from the unbalanced terminal T0.

As shown in FIG. 3, the electrode D2 (having the same shape as the electrode D1 in this example) of the capacitor D is formed on the wiring layer M0 above the wiring layer B1, at a position facing the electrode D1 on the wiring layer B1, the electrode D2 connected to the ground terminal G by a wire 42.

As shown in FIG. 4, a coil portion C1 (first coil portion, first line portion) and a coil portion C2 (second coil portion, second line portion) which constitute the unbalanced transmission line 2 are formed adjacent to each other on the wiring layer M1. Each of the coil portions C1 and C2 forms an equivalent of a quarter-wavelength (λ/4) resonator. An outer end 11*a* of a coil conductor 11 constituting the coil portion C1 is connected to the unbalanced terminal T0, and an inner end 11*b* of the coil conductor 11 is connected to a through hole P. An inner end 12*b* of a coil conductor 12 constituting the coil portion C2 is connected to a through hole P, and an outer end 12*a* of the coil conductor 12 is connected to the electrode D1 of the above-mentioned capacitor D via the through hole P.

As shown in FIG. 5, a coil portion C3 (third coil portion, third line portion) and a coil portion C4 (fourth coil portion, fourth line portion) which constitute the balanced transmission line 3 are formed adjacent to each other on the wiring layer M2. Each of the coil portions C3 and C4 forms an equivalent of a quarter-wavelength (λ/4) resonator, in the same way as the coil portions C1 and C2. The coil portions C3 and C4 of the balanced transmission line 3 are arranged so as to face the coil portions C1 and C2 of the unbalanced transmission line 2, respectively, and the facing portions are magnetically coupled to form couplers. An outer end 21*a* of a coil conductor 21 constituting the coil portion C3 is connected to the balanced terminal T1, and an inner end 21*b* of the coil conductor 21 is connected to a through hole P. An outer end 22*a* of a coil conductor 22 constituting the coil portion C4 is connected to the balanced terminal T2, and an inner end 22*b* of the coil conductor 22 is connected to a through hole P.

As shown in FIG. 6, a wire 31 for connecting the coil portion C3 and the coil portion C4 to the ground terminal G, and a wire 32 for connecting the coil portion C1 and the coil portion C2 to each other are formed on the wiring layer M3. The wire 31 is a branch wire formed so as to connect the two through holes P to the ground terminal G. The wire 31 is connected to the end 21*b* of the coil conductor 21 and the end 22*b* of the coil conductor 22 formed on the wiring layer M2 via the two through holes P. On the other hand, the wire 32 is connected to the end 11*b* of the coil conductor 11 and the end 12*b* of the coil conductor 12 formed on the wiring layer M1 via the through holes P As described above, in this embodiment, the thin film balun 1 constituting the equivalent circuit shown in FIG. 1 can be realized by a multilayer wiring structure in which: the two coil portions C1 and C2 that constitute the unbalanced transmission line are formed on one layer (wiring layer M1); the two coil portions C3 and C4 that constitute the balanced transmission line are formed on another layer (wiring layer M2) that is adjacent to the wiring layer M1; the wire 32 for connecting the coil portions C1 and C2 to each other, and the wire 31 for connecting the coil portions C3 and C4 to each other, are formed on another layer (wiring layer M3) that is adjacent to the wiring layer M2 on the opposite side to the wiring layer M1; and the capacitor having the electrodes D1 and D2 are formed on each of the layers (wiring layers B1 and M0) that are adjacent to the wiring layer M1 on the opposite side to the wiring layer M2. Note that the capacitor D having the electrodes D1 and D2 may be formed on a layer above the wiring layer M3 or may be formed between the wiring layer M0 and the wiring layer M1, instead of being formed on the wiring layer B1 formed immediately above the substrate and the wiring layer M0 formed above the wiring layer B1.

Embodiments 2A to 2K

FIGS. 7 to 17 are horizontal sectional views schematically showing wiring layers B1 in thin film baluns 2A to 2K in embodiments 2A to 2K according to the present invention. As shown in each figure, in the thin film baluns 2A to 2K, the entire capacitor D is arranged, in a plan view, in the above-described area S1 between the outer end of the unbalanced terminal T0 and the outer end of the ground terminal G, and in an area which overlaps with the coil portions C1 and C3 or overlaps with the coil portions C2 and C4 (i.e., the area outside the area S2). In the thin film baluns 2B, 2D and 21 of the thin film baluns 2A to 2K, the entire capacitor D is arranged, in a plan view, in the area S2 between the inner end of the unbalanced terminal T0 and the inner end of the ground terminal G. Note that, although only the electrode D1 of the capacitor D is shown in each of the figures, the electrode D2 having the same shape as that of the electrode D1 is formed at a position facing the electrode D1 in the wiring layer M0.

Embodiments 3A to 3C

Figure 18:
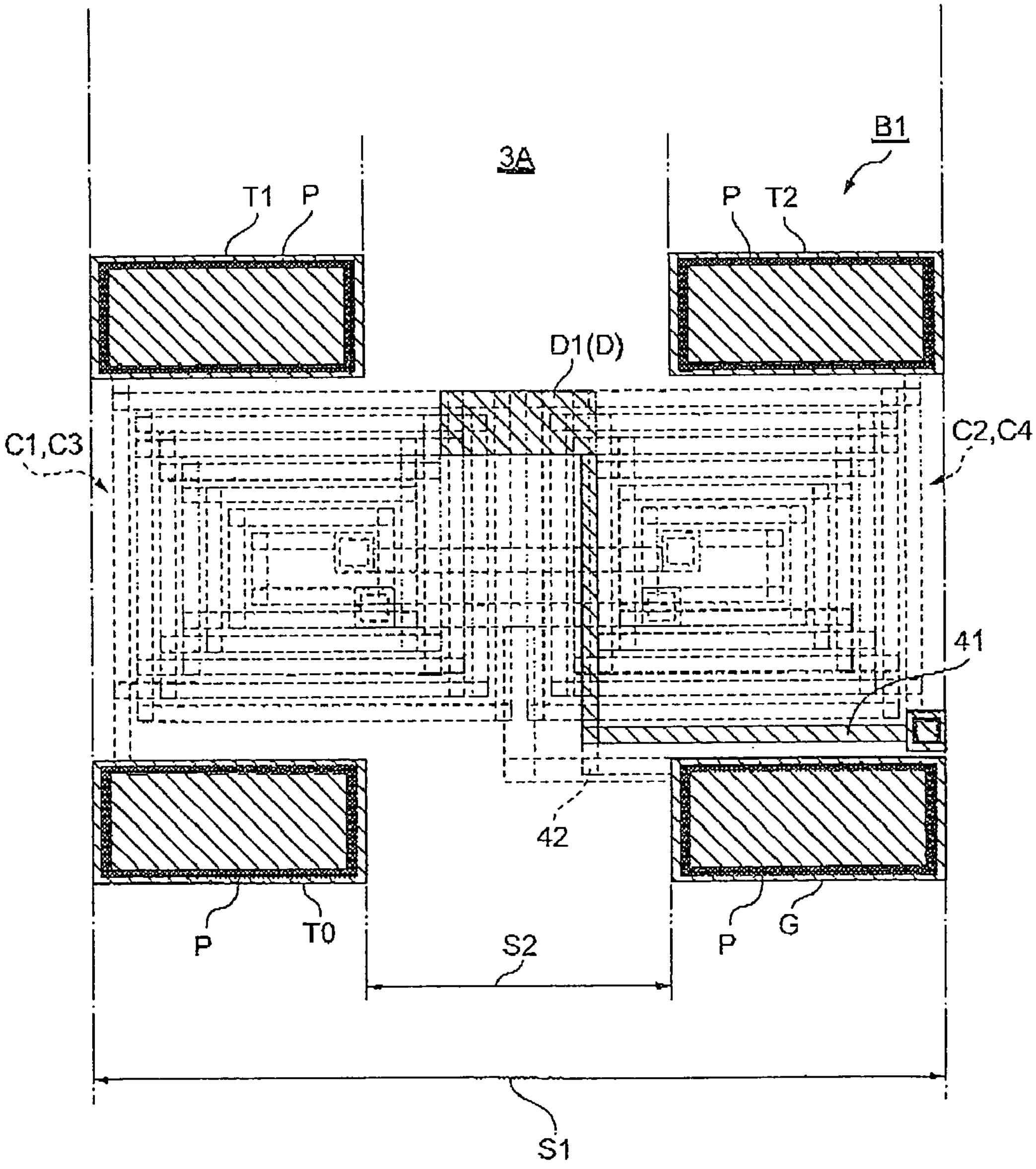
FIG. 18 is a horizontal sectional view showing a wiring layer B1 of a thin film balun 3A.
Figure 19:
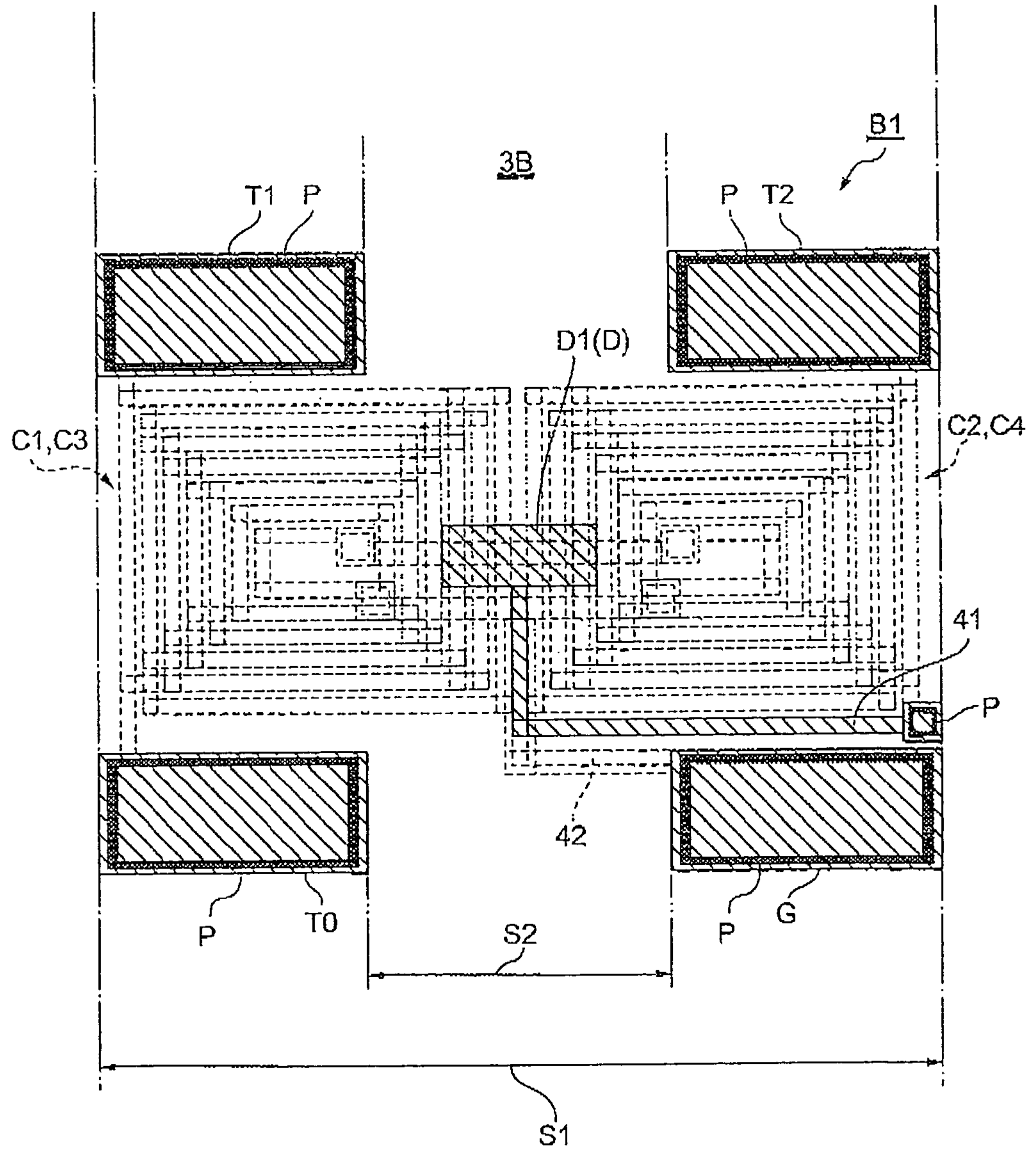
FIG. 19 is a horizontal sectional view showing a wiring layer B1 of a thin film balun 3B.
Figure 20:
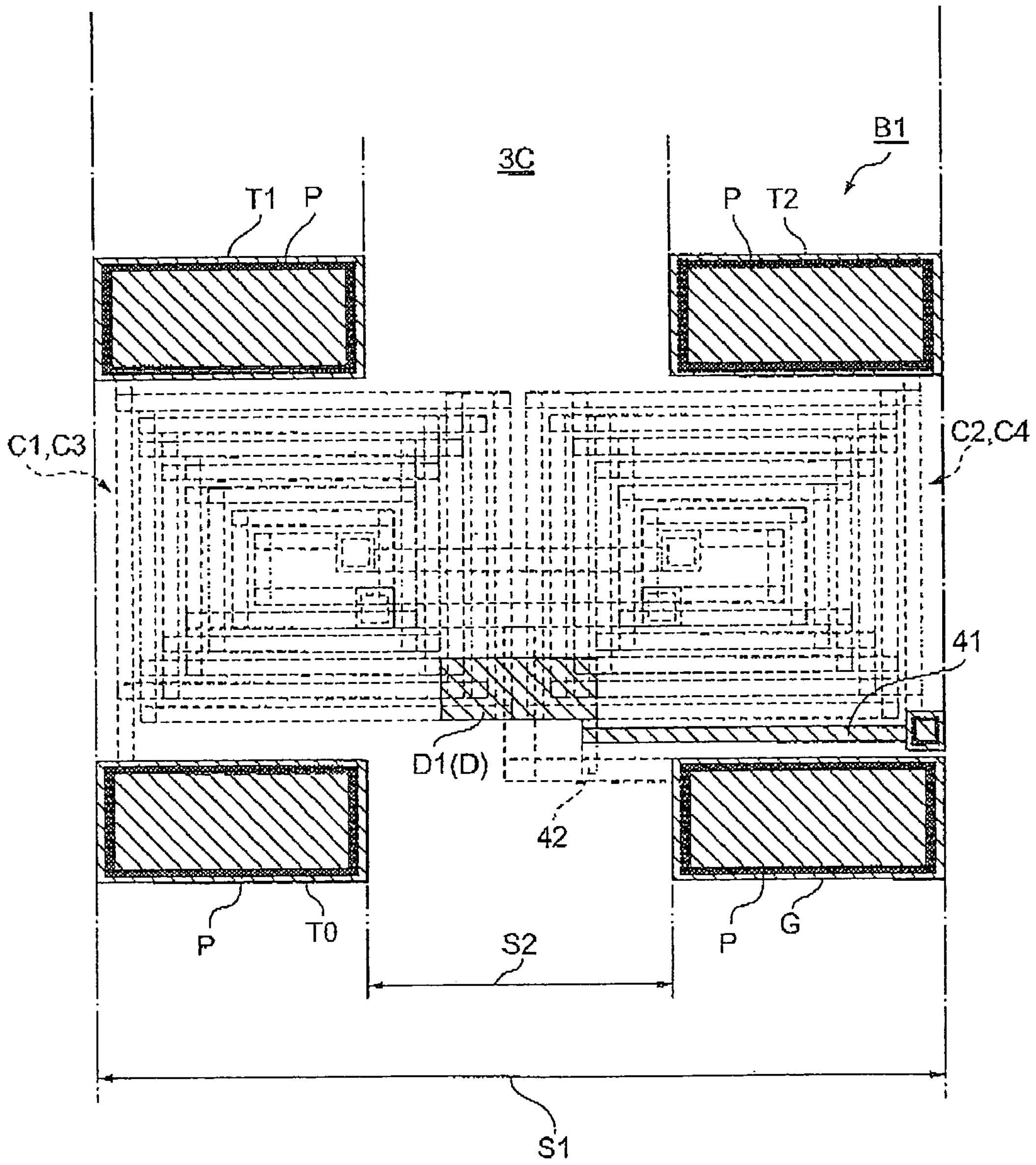
FIG. 20 is a horizontal sectional view showing a wiring layer B1 of a thin film balun 3C.

FIGS. 18 to 20 are horizontal sectional views schematically showing wiring layers B1 in thin film baluns 3A to 3C in embodiments 3A to 3C according to the present invention. As shown in each figure, in the thin film baluns 3A to 3C, the entire capacitor D is arranged, in a plan view, in the area S2 between the inner end of the unbalanced terminal T0 and the inner end of the ground terminal G, the capacitor D spanning a first magnetic coupling area formed by the coil portions C1 and C3 and a second magnetic coupling area formed by the coil portions C2 and C4. Note that, although only the electrode D1 of the capacitor D is shown in each of the figures, the electrode D2 having the same shape as that of the electrode D1 is formed at a position facing the electrode D1 in the wiring layer M0.

COMPARATIVE EXAMPLE

Figure 21:
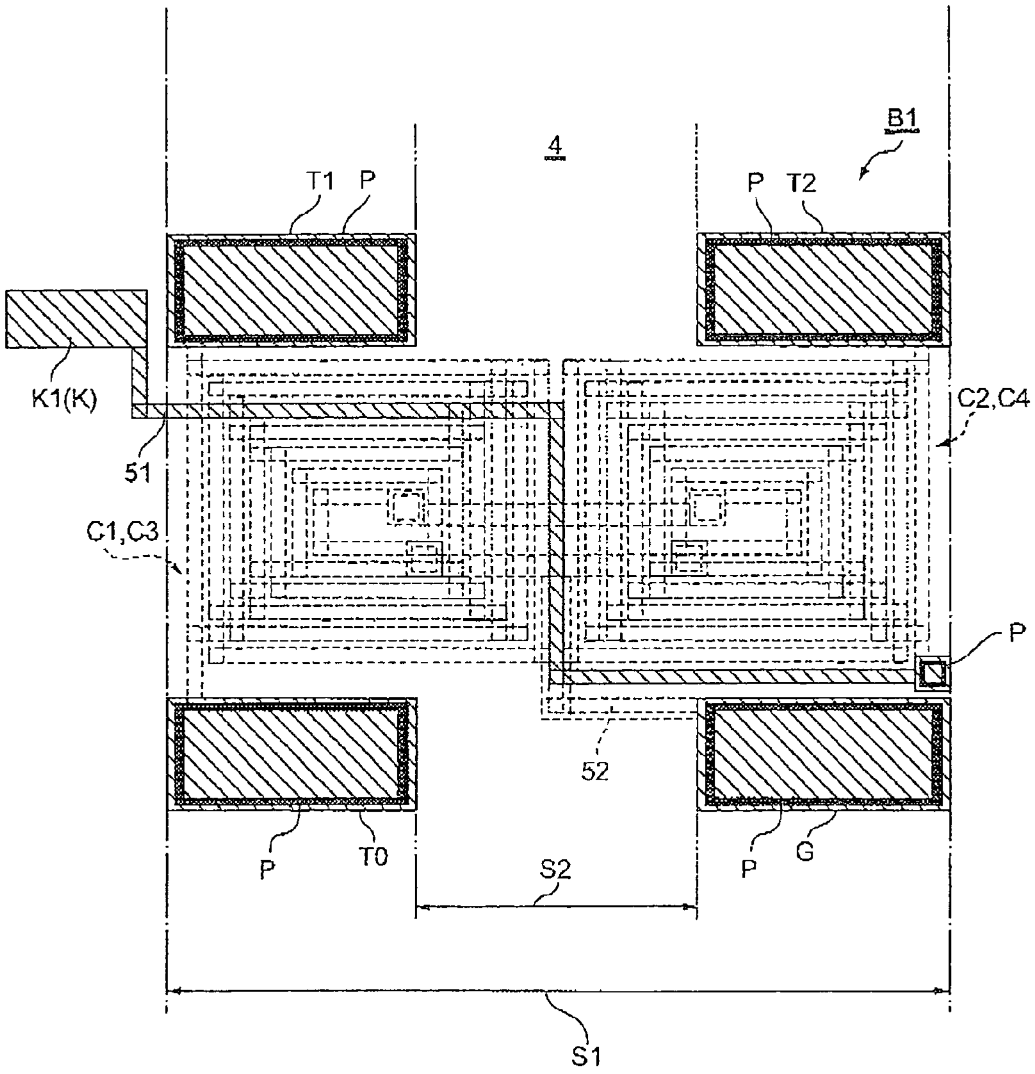
FIG. 21 is a horizontal sectional view showing a wiring layer 81 of a thin film balun 4 (comparative example).
Figure 22:
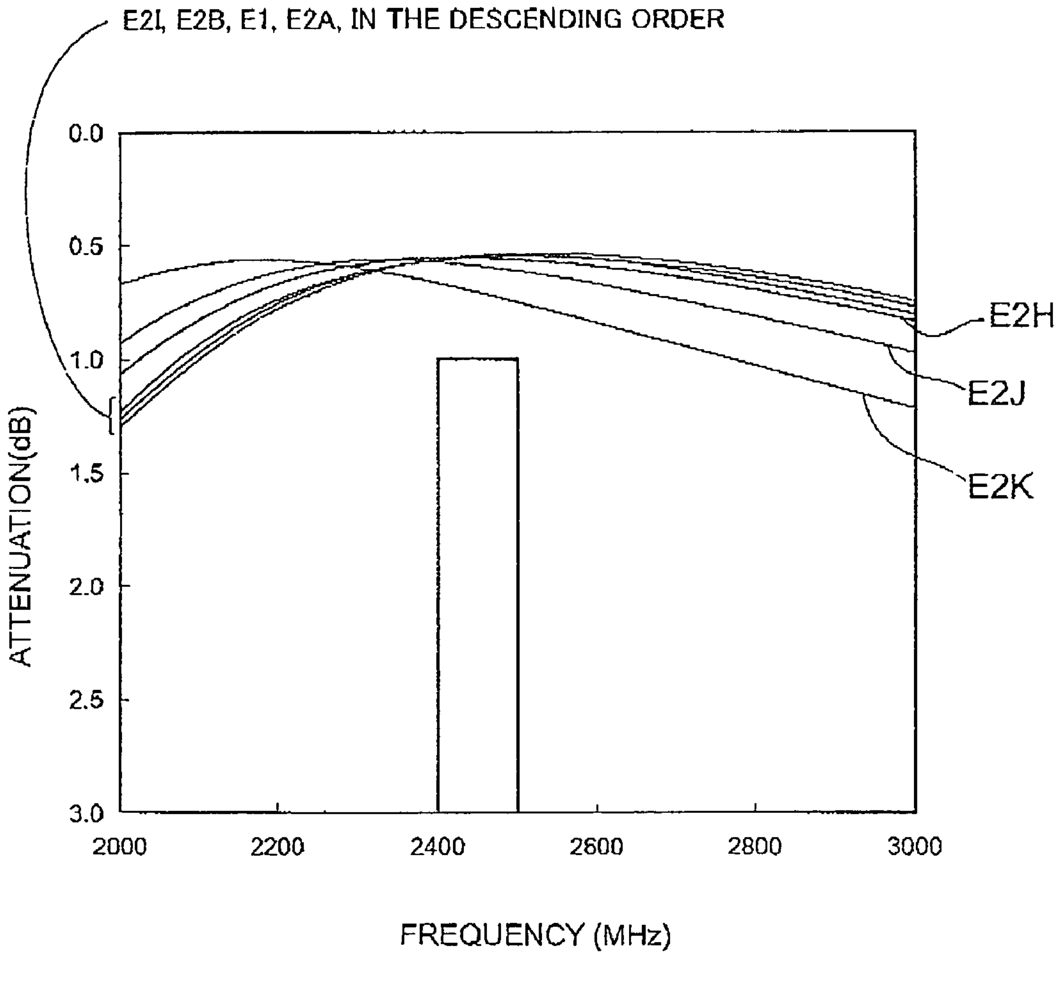
FIG. 22 is a graph showing the evaluation results of a passage characteristic.
Figure 23:
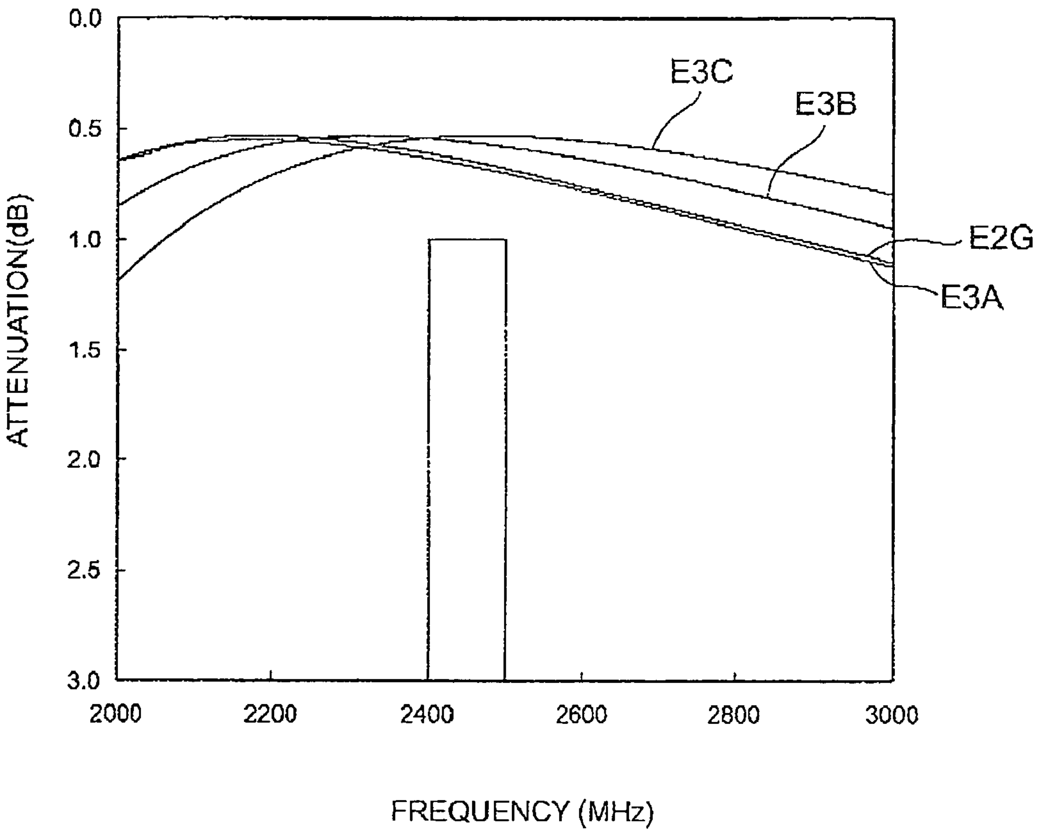
FIG. 23 is a graph showing the evaluation results of a passage characteristic.
Figure 24:
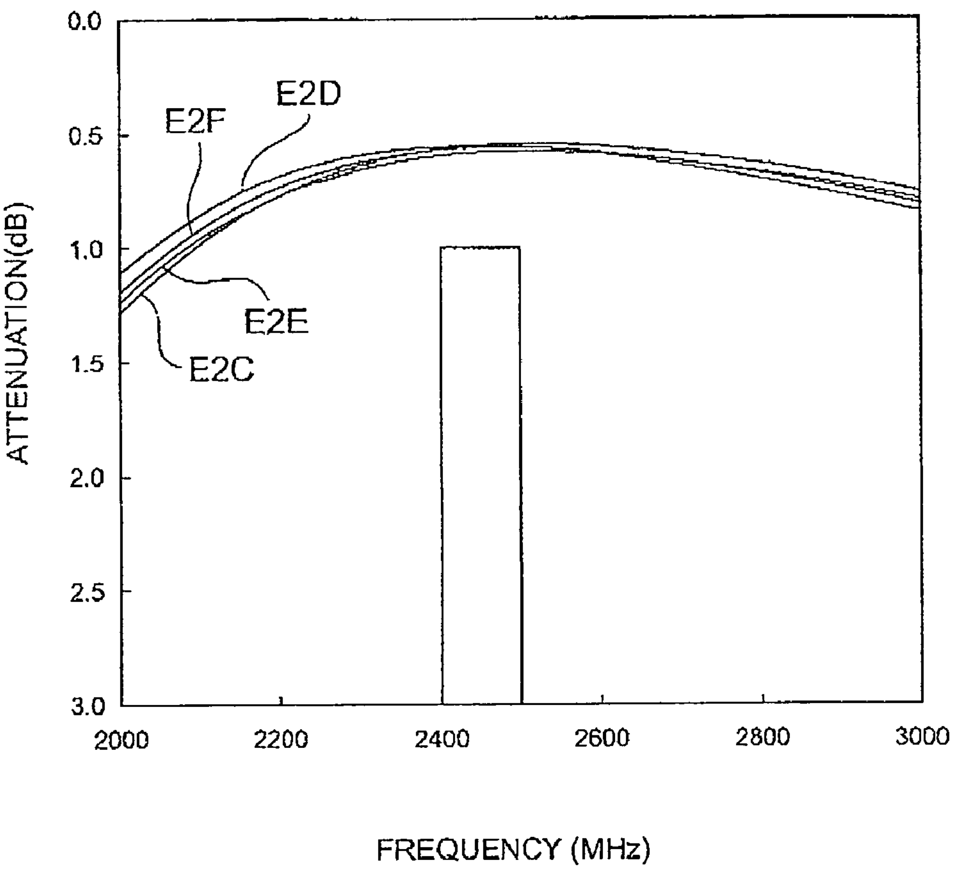
FIG. 24 is a graph showing the evaluation results of a passage characteristic.

FIG. 21 is a horizontal sectional view schematically showing a wiring layer B1 in a thin film balun 4 according to a comparative example. As shown in FIG. 21, in the thin film balun 4 of the comparative example, a capacitor K is arranged, in a plan view, in an area outside the area S1 between the outer end of the unbalanced terminal T0 and the outer end of the ground terminal G. Note that, although only an electrode K1 of the capacitor K is shown in FIG. 21, a counter electrode (corresponding to the electrode D2 in the embodiments of the present invention) having the same shape as that of the electrode K1 is formed at a position facing the electrode K1 in the wiring layer M0. The electrode K1 is connected to a through hole P in the vicinity of the ground terminal G by a wire 51, and the counter electrode is connected to the ground terminal G by a wire 52.

(Evaluation of Characteristics)

A passage characteristic (attenuation characteristic) for a transmission signal in each of the above-described thin film baluns 1, 2A to 2K and 3A to 3C in each embodiment and the above-described thin film balun 4 in the comparative example were evaluated through simulation, and the evaluation results are shown in FIGS. 22 to 25. The passage characteristic of each thin film balun was evaluated through the simulation where an evaluation target frequency (resonant frequency fr) of the transmission signal was set to the range between 2400 and 2500 MHz and a targeted specification of attenuation in this frequency range was set to below 1 dB.

In each figure, the curved lines E1, E2A to E2K and E3A to E3C show the evaluation results of the thin film baluns 1, 2A to 2K and 3A to 3C, respectively, and the curved line R4 shows the evaluation result of the thin film balun 4. These results indicate that the thin film balun in each embodiment had suitable passage characteristic which satisfied the targeted specification. Of these thin film baluns, it was found that the thin film baluns 1, 2B, 2D, 2I and 3A to 3C, in which the capacitor D is arranged in the area S2 between the inner end of the unbalanced terminal T0 and the inner end of the ground terminal G, tended to have even better passage characteristics as compared to the thin film baluns in the other embodiments. In particular, the evaluation results concerning the thin film baluns 1 and 3A to 3C (FIGS. 22 and 23) indicate that the thin film baluns in which the electrodes D1 and D2 of the capacitor D are arranged at a position closer to the unbalanced terminal T0, rather than to the balanced terminals T1 and T2, have even better passage characteristics.

Figure 25:
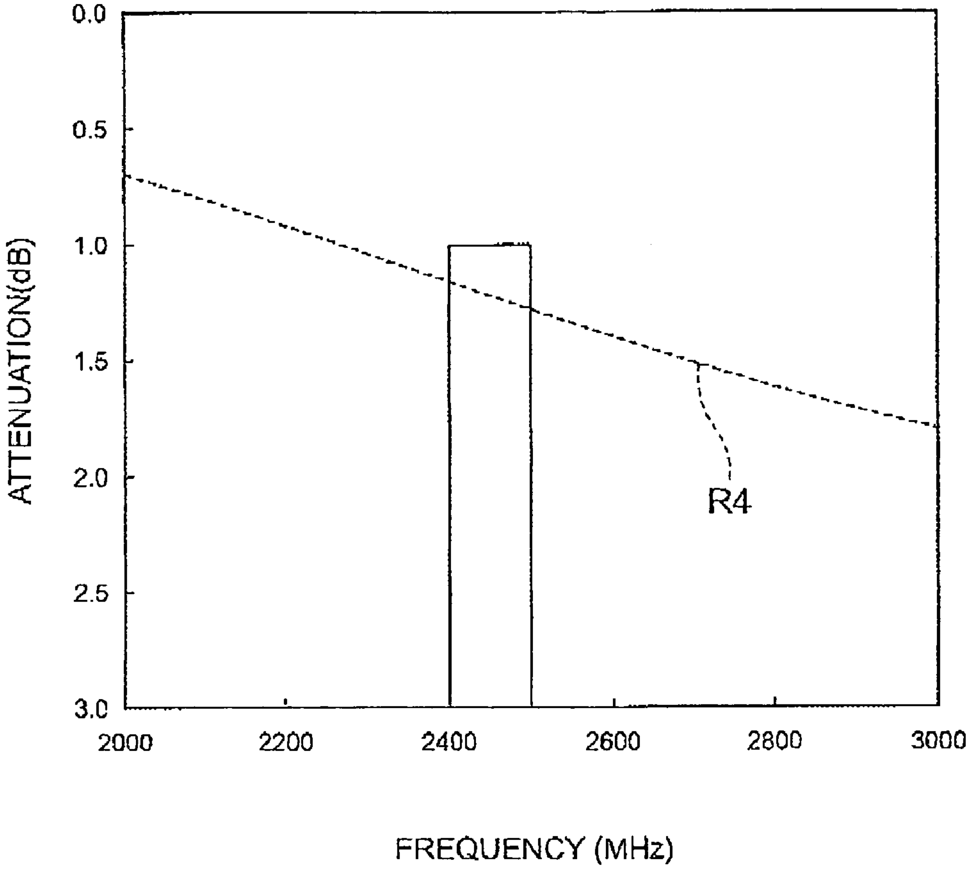
FIG. 25 is a graph showing the evaluation results of a passage characteristic.

On the other hand, it was found that, as shown in FIG. 25, the thin film balun 4 in the comparative example had a larger attenuation in the frequency range of the targeted specification (in the evaluation target frequency range) in the passage characteristic as compared to the thin film baluns according to the present invention, and the attenuation in the thin film balun 4 did not satisfy the targeted specification.

Note that, as mentioned above, the present invention is not limited to the embodiments above, but various modifications may be made to the present invention without departing from the scope of the present invention. For example, the positions of the unbalanced terminal T0, the balanced terminals T1 and T2 and the ground terminal G are not limited to the positions shown in the figures. The multilayer wiring structure constituting the thin film balun may have more or fewer layers than shown. The layer structure may obviously be reversed so that the wiring layer B1 is configured as the uppermost layer while the wiring layer M3 is configured as the lowermost layer. Various coil arrangements may be employed without departing from the scope of the present invention.

In the thin film balun according to the present invention, the C component (capacitor) connected to the ground terminal is provided in the area between the outer end (the end most distant from the ground terminal) of the unbalanced terminal and the outer end (the end most distant from the unbalanced terminal) of the ground terminal, thereby effectively preventing a resonant frequency from being increased to a high frequency due to size and thickness reductions of the thin film balun, and thus realizing a desired preferable passage characteristic. Accordingly, the present invention can be widely applied to wireless communication devices, apparatuses, modules and systems, which in particular require size and thickness reductions, as well as equipment provided therewith and production thereof.

The present application is based on Japanese priority application No. 2008-333093 filed on Dec. 26, 2008, the entire contents of which are hereby incorporated by reference.

What is claimed is:

1. A thin film balun comprising:

an unbalanced transmission line having a first line portion and a second line portion;

a balanced transmission line having a third line portion and a fourth line portion which are arranged so as to face the first line portion and the second line portion, respectively, the third line portion and the fourth line portion magnetically coupling with the first line portion and the second line portion, respectively;

an unbalanced terminal connected to the first line portion;

a ground terminal connected to the second line portion via a C component;

a first balanced terminal connected to the third line portion; and a second balanced terminal connected to the fourth line portion, wherein:

the first line portion has a first coil portion, the second line portion has a second coil portion, the third line portion has a third coil portion, the fourth line portion has a fourth coil portion, and the C component is provided in an area where the first coil portion and the third coil portion are overlapped or the second coil portion and the fourth coil portion are overlapped in a plan view.

2. The thin film balun according to claim 1, wherein the C component is provided in an area between an inner end of the unbalanced terminal and an inner end of the ground terminal.

3. The thin film balun according to claim 1, wherein the C component is provided at a position closer to the unbalanced terminal and the ground terminal rather than to the balanced terminal,

4. The thin film balun according to claim 1, wherein the C component includes a capacitor having a first electrode connected to the second coil portion, and a second electrode, connected to the ground terminal, arranged so as to face the first electrode via a dielectric layer.

* * * * *